United States Patent
Thibaut et al.

(10) Patent No.: US 11,856,724 B2
(45) Date of Patent: *Dec. 26, 2023

(54) SYSTEM COMPRISING A RACK, WITH SUPPORT MEMBERS AND COMPONENTS INSERTABLE IN THE RACK AND CONNECTABLE VIA LIQUID CONNECTORS

(71) Applicant: OVH, Roubaix (FR)

(72) Inventors: Christophe Maurice Thibaut, Noyelles les Seclin (FR); Etienne Zahm, La Madeleine (FR); Henryk Klaba, Roubaix (FR); Jules Hermann Bonenfant, Lys Lez Lannoy (FR); Valentin Cartigny, Mons-en-Barœul (FR)

(73) Assignee: OVH, Roubaix (FR)

( * ) Notice: Subject to any disclaimer, the term of this patent is extended or adjusted under 35 U.S.C. 154(b) by 0 days.

This patent is subject to a terminal disclaimer.

(21) Appl. No.: 17/727,312

(22) Filed: Apr. 22, 2022

(65) Prior Publication Data

US 2022/0248555 A1 Aug. 4, 2022

Related U.S. Application Data

(63) Continuation-in-part of application No. 17/344,302, filed on Jun. 10, 2021, now Pat. No. 11,439,035, (Continued)

(30) Foreign Application Priority Data

Nov. 30, 2018 (EP) ...................... 18315047
May 27, 2021 (EP) ...................... 21305705

(51) Int. Cl.
*H05K 7/20* (2006.01)
*H05K 7/14* (2006.01)
*H01R 13/631* (2006.01)

(52) U.S. Cl.
CPC ......... *H05K 7/1489* (2013.01); *H01R 13/631* (2013.01); *H05K 7/1452* (2013.01); *H05K 7/20781* (2013.01); *H05K 7/20818* (2013.01)

(58) Field of Classification Search
CPC .. H01R 13/631; H05K 7/1452; H05K 7/1489; H05K 7/20781; H05K 7/20818
See application file for complete search history.

(56) References Cited

U.S. PATENT DOCUMENTS

| 4,477,862 A | 10/1984 | Gonzales |
| 5,280,229 A | 1/1994 | Faude et al. |

(Continued)

FOREIGN PATENT DOCUMENTS

| CN | 1507685 A | 6/2004 |
| CN | 101341810 A | 1/2009 |

(Continued)

OTHER PUBLICATIONS

Notice of Allowance with regard to the counterpart U.S. Appl. No. 16/780,411 dated Dec. 22, 2022.

(Continued)

*Primary Examiner* — Jacob R Crum
(74) *Attorney, Agent, or Firm* — BCF LLP

(57) ABSTRACT

A system comprises a rack, a support member, and a component configured for being supported in the rack by the support member. The support member is selectively insertable in the rack and comprises a plate at its rear end, the plate extending at an angle from a direction of insertion of the support member in the rack, the support member further comprising a first liquid connector mounted to the plate. The component comprises a second liquid connector mounted on a rear edge of the component, the second liquid connector being connectable to the first liquid connector when the support member and the component are inserted in the rack.

(Continued)

A method comprises mounting the first and second liquid connectors to the support member and to the component, respectively, inserting the support member to the rack, and inserting the component in the rack until both liquid connectors are connected.

19 Claims, 25 Drawing Sheets

Related U.S. Application Data which is a continuation of application No. 16/690,344, filed on Nov. 21, 2019, now Pat. No. 11,064,628.

(56) References Cited

U.S. PATENT DOCUMENTS

| | | | |
|---|---|---|---|
| 5,297,009 A * | 3/1994 | Gelez | H05K 7/1411 211/41.17 |
| 6,144,561 A | 11/2000 | Cannella et al. | |
| 6,822,874 B1 | 11/2004 | Marler | |
| 6,836,407 B2 | 12/2004 | Faneuf et al. | |
| 7,132,833 B2 | 11/2006 | Layden et al. | |
| 7,480,138 B2 | 1/2009 | Kogan et al. | |
| 7,562,779 B2 | 7/2009 | Bravo et al. | |
| 7,661,545 B2 | 2/2010 | Hardy et al. | |
| 8,009,438 B2 | 8/2011 | Leigh et al. | |
| 9,019,706 B2 | 4/2015 | Ning et al. | |
| 9,295,169 B1 | 3/2016 | Spinner et al. | |
| 9,343,916 B2 | 5/2016 | Emslie | |
| 10,164,373 B1 | 12/2018 | Cheon et al. | |
| 2002/0067601 A1* | 6/2002 | Hsu | H05K 7/1425 361/752 |
| 2002/0141544 A1 | 10/2002 | Brown et al. | |
| 2002/0179549 A1* | 12/2002 | Felcman | H05K 7/1494 211/151 |
| 2004/0057211 A1 | 3/2004 | Kondo et al. | |
| 2005/0270751 A1* | 12/2005 | Coglitore | G06F 1/183 312/223.3 |
| 2006/0203460 A1 | 9/2006 | Aviv | |
| 2006/0274508 A1 | 12/2006 | LaRiviere et al. | |
| 2008/0114865 A1 | 5/2008 | Rothman et al. | |
| 2010/0176762 A1 | 7/2010 | Daymude et al. | |
| 2010/0268802 A1 | 10/2010 | Lipps et al. | |
| 2011/0075349 A1 | 3/2011 | Ma et al. | |
| 2011/0134601 A1 | 6/2011 | Sa | |
| 2011/0193524 A1 | 8/2011 | Hazzard et al. | |
| 2011/0289327 A1 | 11/2011 | Nolterieke et al. | |
| 2011/0308783 A1 | 12/2011 | Nicewonger | |
| 2011/0313576 A1 | 12/2011 | Nicewonger | |
| 2013/0102237 A1 | 4/2013 | Zhou et al. | |
| 2014/0062390 A1 | 3/2014 | Webber | |
| 2014/0277784 A1 | 9/2014 | Mick et al. | |
| 2015/0208551 A1 | 7/2015 | Davidson | |
| 2015/0362691 A1* | 12/2015 | Montgelas | F16L 3/01 29/428 |
| 2016/0066480 A1 | 3/2016 | Eckberg et al. | |
| 2016/0205800 A1 | 7/2016 | Roberts | |
| 2016/0381834 A1* | 12/2016 | Harvilchuck | F16L 37/32 285/91 |
| 2017/0027068 A1 | 1/2017 | Dane et al. | |
| 2017/0027079 A1 | 1/2017 | Dombrowski et al. | |
| 2017/0047751 A1 | 2/2017 | Fernandes | |
| 2017/0127575 A1 | 5/2017 | Lunsman et al. | |
| 2017/0164500 A1 | 6/2017 | Van et al. | |
| 2017/0359918 A1 | 12/2017 | Klaba et al. | |
| 2018/0014433 A1* | 1/2018 | Klein | H01L 35/28 |
| 2018/0150240 A1 | 5/2018 | Bernat et al. | |
| 2018/0151975 A1 | 5/2018 | Aoki | |
| 2018/0231295 A1 | 8/2018 | Akiyama et al. | |
| 2018/0241244 A1 | 8/2018 | Stevens et al. | |
| 2019/0138064 A1 | 5/2019 | Abali et al. | |
| 2020/0103955 A1 | 4/2020 | Lee et al. | |
| 2020/0201408 A1 | 6/2020 | Lehwalder et al. | |
| 2020/0210367 A1 | 7/2020 | Jabori et al. | |

FOREIGN PATENT DOCUMENTS

| | | |
|---|---|---|
| CN | 102129274 A | 7/2011 |
| CN | 102480432 A | 5/2012 |
| CN | 103138942 A | 6/2013 |
| CN | 104808542 A | 7/2015 |
| CN | 104977998 A | 10/2015 |
| CN | 105993099 A | 10/2016 |
| CN | 107819228 A | 3/2018 |
| EP | 0990377 A1 | 4/2000 |
| EP | 3364736 A1 | 8/2018 |
| WO | 9856223 A1 | 12/1998 |
| WO | 2019050514 A1 | 3/2019 |

OTHER PUBLICATIONS

Office Action with regard to the counterpart U.S. Appl. No. 16/780,411 dated Jul. 29, 2022.
"Charging Station", Bamboo Deluxe Charging Station, https://www.lipperinternational.com/, https://www.ipperinternational.com/products/bamboo-deluxe-charging station/, accessed on Nov. 20, 2019, pdf 4 pages.
Extended European Search Report with regard to EP Patent Application No. 18315047.3 dated Sep. 2, 2019.
Partial European Search Report with regard to EP Patent Application No. 18315047.3 dated May 22, 2019.
Extended European Search Report with regard to EP Patent Application No. 19315006.7 dated Jul. 31, 2019.
Notice of Allowance with regard to the counterpart U.S. Appl. No. 16/690,344 dated Mar. 10, 2021.
Office Action with regard to the counterpart U.S. Appl. No. 16/780,411 dated Mar. 7, 2022.
Notification of Grant with regard to the counterpart CN Patent Application No. 202010090628.0 dated Mar. 22, 2022.
English Abstract for CN102129274 retrieved on Espacenet on Apr. 6, 2022.
English Abstract for CN101341810 retrieved on Espacenet on Apr. 6, 2022.
English Abstract for CN104977998 retrieved on Espacenet on Apr. 6, 2022.
English Abstract for CN102480432 retrieved on Espacenet on Apr. 6, 2022.
English Abstract for CN103138942 retrieved on Espacenet on Apr. 6, 2022.
English Abstract for CN1507685 retrieved on Espacenet on Apr. 6, 2022.
Office Action with regard to the counterpart CN Patent Application No. 201911199888.5 dated Jan. 4, 2022.
English Abstract for CN105993099 retrieved on Espacenet on Jan. 24, 2022.
English Abstract for CN107819228 retrieved on Espacenet on Jan. 24, 2022.
English Abstract for CN104808542 retrieved on Espacenet on Jan. 24, 2022.

* cited by examiner

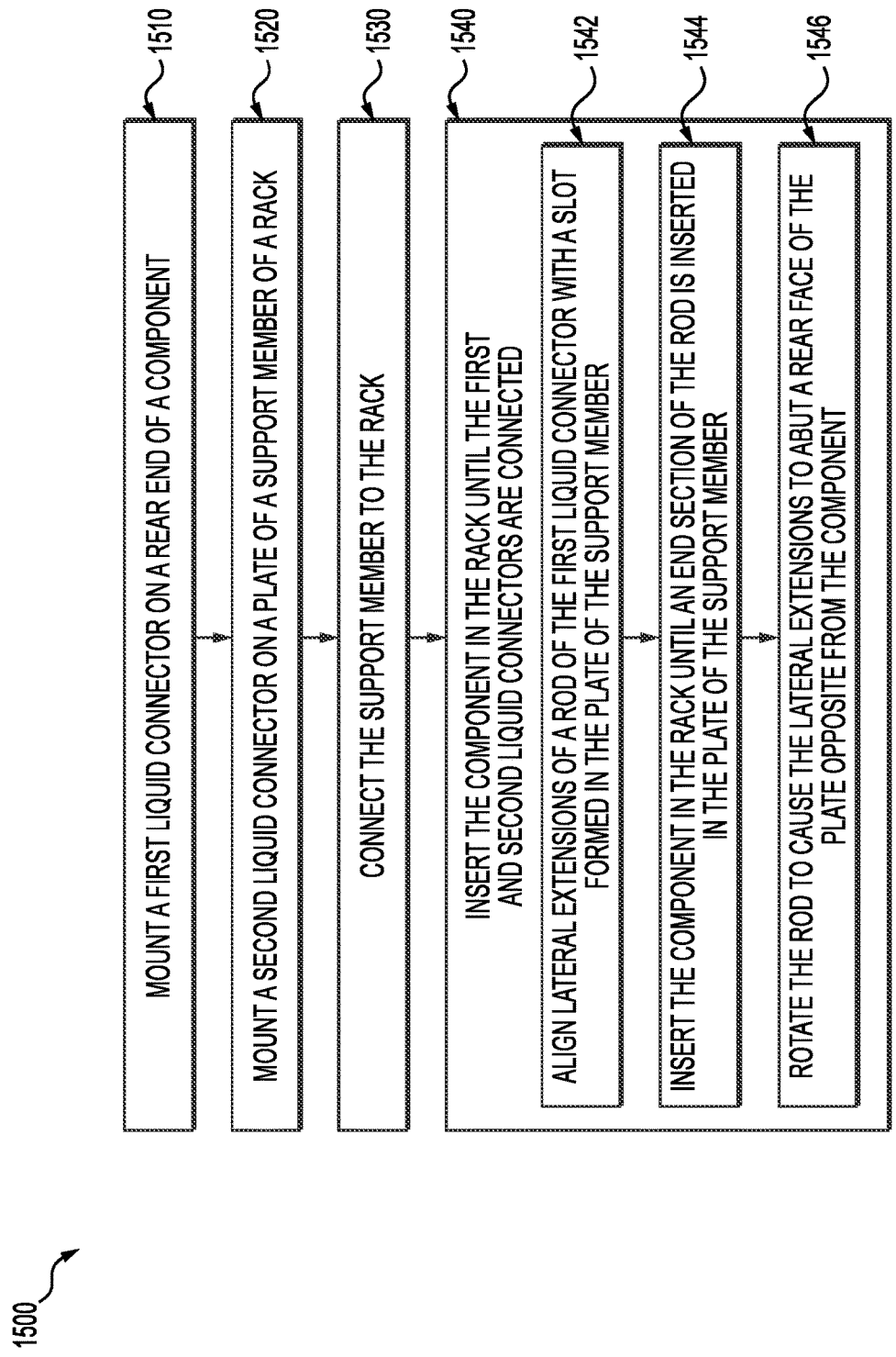

SYSTEM COMPRISING A RACK, WITH SUPPORT MEMBERS AND COMPONENTS INSERTABLE IN THE RACK AND CONNECTABLE VIA LIQUID CONNECTORS

CROSS-REFERENCE

The present application is a continuation-in-part of U.S. patent application Ser. No. 17/344,302, filed Jun. 10, 2021, which is a continuation of U.S. patent application Ser. No. 16/690,344, filed Nov. 21, 2019, which claims priority to European Patent Application No. 18315047.3, filed Nov. 30, 2018, the entirety of each of which is incorporated herein by reference. The present application also claims priority from European Patent Application No. 21305705.2, filed May 27, 2021, the entirety of which is incorporated herein by reference.

FIELD

The present technology relates to enclosures adapted to receive and provide fluid cooling to electronic equipment. In particular, a system comprising a rack, with support members and components insertable in the rack and connectable via liquid connectors is disclosed.

BACKGROUND

Electronic components, for example servers, memory banks, computer discs, and the like, are conventionally mounted one above the other in equipment racks.

Large data centers that may contain thousands or even tens of thousands of servers. New servers may be added on a daily basis. Some servers may fail and need to be replaced from time to time. Installation and removal of components in equipment racks is a daily routine task for operators. Care must be taken to properly align components within equipment racks. When installed in haste, components may be improperly aligned in their racks, leading to equipment failure or to bad electrical and/or data connections. Consequently, installation of components in equipment racks is a delicate and time-consuming operation.

The racks, including equipment mounted in their backplanes, consume large amounts of electric power and generate significant amounts of heat. Cooling needs are important in such racks. Water-cooling may be used, but is difficult to provision in an efficient way. The need for hydraulic connections to be fully watertight is self-evident given the presence of electronic equipment.

Improvements are still desirable in the maintenance and provisioning of large data centers.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY

Embodiments of the present technology have been developed based on developers' appreciation of shortcomings associated with the prior art.

In one aspect, various implementations of the present technology provide a system, comprising:

a rack;

a support member configured to be selectively inserted in the rack, the support member comprising a plate at its rear end, the plate extending at an angle from a direction of insertion of the support member in the rack, the support member further comprising a first liquid connector mounted to the plate; and a component configured for being supported in the rack by the support member, the component comprising a second liquid connector mounted on a rear edge of the component, the second liquid connector being configured for connecting to the first liquid connector when the support member and the component are inserted in the rack.

In some implementations of the present technology, the first liquid connector comprises a feed port and a return port mounted on the plate; the second liquid connector comprises an inlet port and an outlet port; the inlet port is adapted for mating with the feed port when the first and second liquid connectors are connected; and the outlet port is adapted for mating with the return port when the first and second liquid connectors are connected.

In some implementations of the present technology, the system further comprises: a feed tube connected to the feed port; and a return tube connected to the return port; wherein the feed tube and the return tube extend behind the plate of the support member for providing liquid cooling to the component.

In some implementations of the present technology, the system further comprises: an inlet tube mounted to the inlet port; and an outlet tube mounted to the outlet port; wherein the inlet tube and the outlet tube are mounted on the component for distributing liquid cooling to a heat-generating unit of the component.

In some implementations of the present technology, a slot is formed on the plate; and the component comprises a rod having lateral extensions on an end section protruding beyond the rear edge of the component, the rod being rotatable for aligning the lateral extensions with the slot upon mounting the component in the rack, for allowing insertion of the end section in the slot and for subsequently placing the lateral extensions out of alignment with the slot to cause the lateral extensions to abut on a face of the plate opposite from the component for maintaining a connection of the first and second liquid connectors.

In some implementations of the present technology, the slot is formed between the feed port and the return port.

In some implementations of the present technology, a center of the feed port, a center of the return port and a center of the slot form a triangle.

In some implementations of the present technology, the rod extends to a front edge of the component.

In some implementations of the present technology, the first liquid connector is a male liquid connector and the second liquid connector is a female liquid connector.

In some implementations of the present technology, the first liquid connector is a female liquid connector and the second liquid connector is a male liquid connector.

In some implementations of the present technology, the rack comprises two opposite mounting panels; the support member is a first support member configured for mounting on one of the mounting panels; the system further comprises a second support member configured for mounting on another one of the mounting panels; and the component is configured for being supported in the rack by the two mounting panels.

In some implementations of the present technology, each mounting panel comprises a plurality of rack mounting features distributed along a same horizontal axis, corresponding rack mounting features being disposed at corresponding heights on the two mounting panels; and the first and second support members each comprise a plurality of connector legs configured for connecting to corresponding ones of the rack mounting features when the first and second support members are inserted in the rack.

In some implementations of the present technology, the support member further comprises an elongate plate extending from a front end to the rear end of the support member; the plate extends perpendicularly from the elongate plate; and the support member further comprises a tab positioned on its front end, the tab being adapted for being folded against the rack for locking a position of the support member when mounted in the rack.

In some implementations of the present technology, the rack defines a plurality of parallel stages, each respective stage being adapted for receiving a respective support member and a respective component.

In some implementations of the present technology, a spacing between each of the plurality of parallel stages corresponds to a standard-size rack unit.

In the context of the present specification, unless expressly provided otherwise, a computer system may refer, but is not limited to, an "electronic device", an "operation system", a "system", a "computer-based system", a "controller unit", a "monitoring device", a "control device" and/or any combination thereof appropriate to the relevant task at hand.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where:

FIG. 25 is a sequence diagram of a method of mounting a component in a rack in accordance with another embodiment of the present technology.

Figure 1:
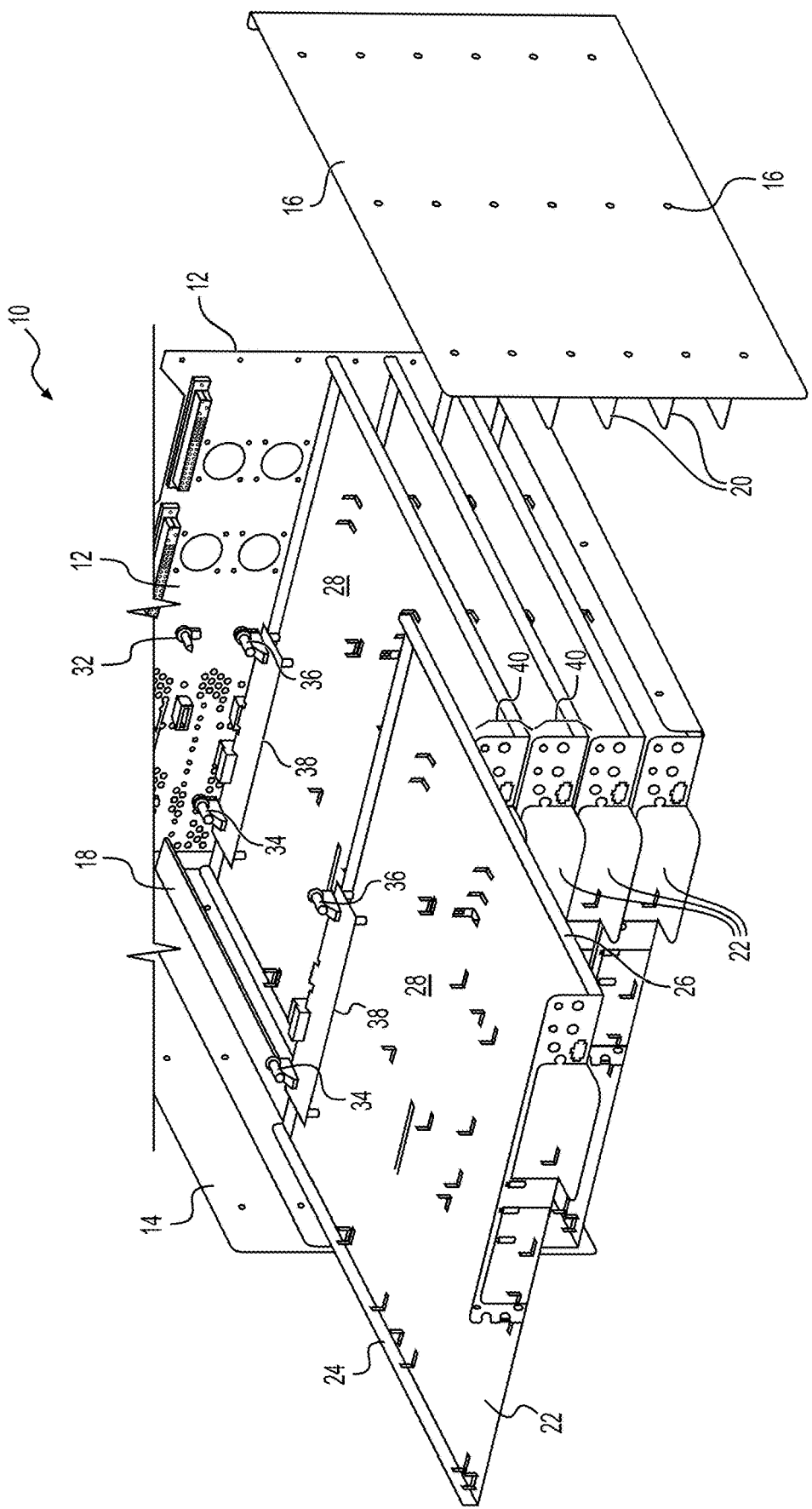
FIG. 1 is a perspective, exploded view of a rack in accordance with an embodiment of the present technology.

It should also be noted that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology and are included within its spirit and scope.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudo-code, and the like represent various processes that may be substantially represented in computer-readable media and so executed by a computer or processor, whether or not such computer or processor is explicitly shown.

With these fundamentals in place, we will now consider some non-limiting examples to illustrate various implementations of aspects of the present technology.

The present technology allows to efficiently mount equipment in a rack, including without limitation servers, data storage solutions, and the like. In at least one variant, fluidic connections may be included for the provision of liquid cooling.

In one aspect, the present technology introduces a component insertable in a rack that includes a pair of female connectors that come in alignment with a pair of male connectors located in the backplane of the rack when the component is inserted. The rack includes mechanical guides to generally locate the insertable components. The female connectors of a given insertable component and the male connectors in the backplane of the rack are positioned so that, when the given component is at least partially inserted in the rack and the rear end of the given component is placed near the backplane, precise mechanical alignment of the given component is provided by partial and then full insertion of the male connectors in the female connectors.

In an embodiment, a plurality of pairs of male connectors are mounted in the backplane, each pair being vertically separated from a next pair by a typical height of the insertable components so that plural insertable components can be received in this manner in the rack.

In the same or another embodiment, fluidic connections for the supply of liquid cooling in the backplane of the rack are provided. In addition to the above described rack and component, a liquid adaptor is mounted on the component. The liquid adaptor includes a feed port and a return port that are respectively meant for mating with an inlet port and an outlet port in the backplane of the rack. An elongate rod part of the liquid adaptor has an end section that penetrates in a slot of the backplane. Rotating the elongate rod locks the component in place against the backplane, within the rack. In a variant, the inlet and outlet ports may supplement the male connectors and the feed and return ports may be provided in addition to the female connectors. In another variant, the inlet and outlet ports may form one or both of the male connectors and the feed and return ports may form one or both of the female connectors.

In the present specification, the term rack should be understood as synonymous with enclosure, chassis, cabinet and similar terms. The term system may encompass a combination of elements, including without limitation a rack and a component inserted in the rack.

Figure 2:
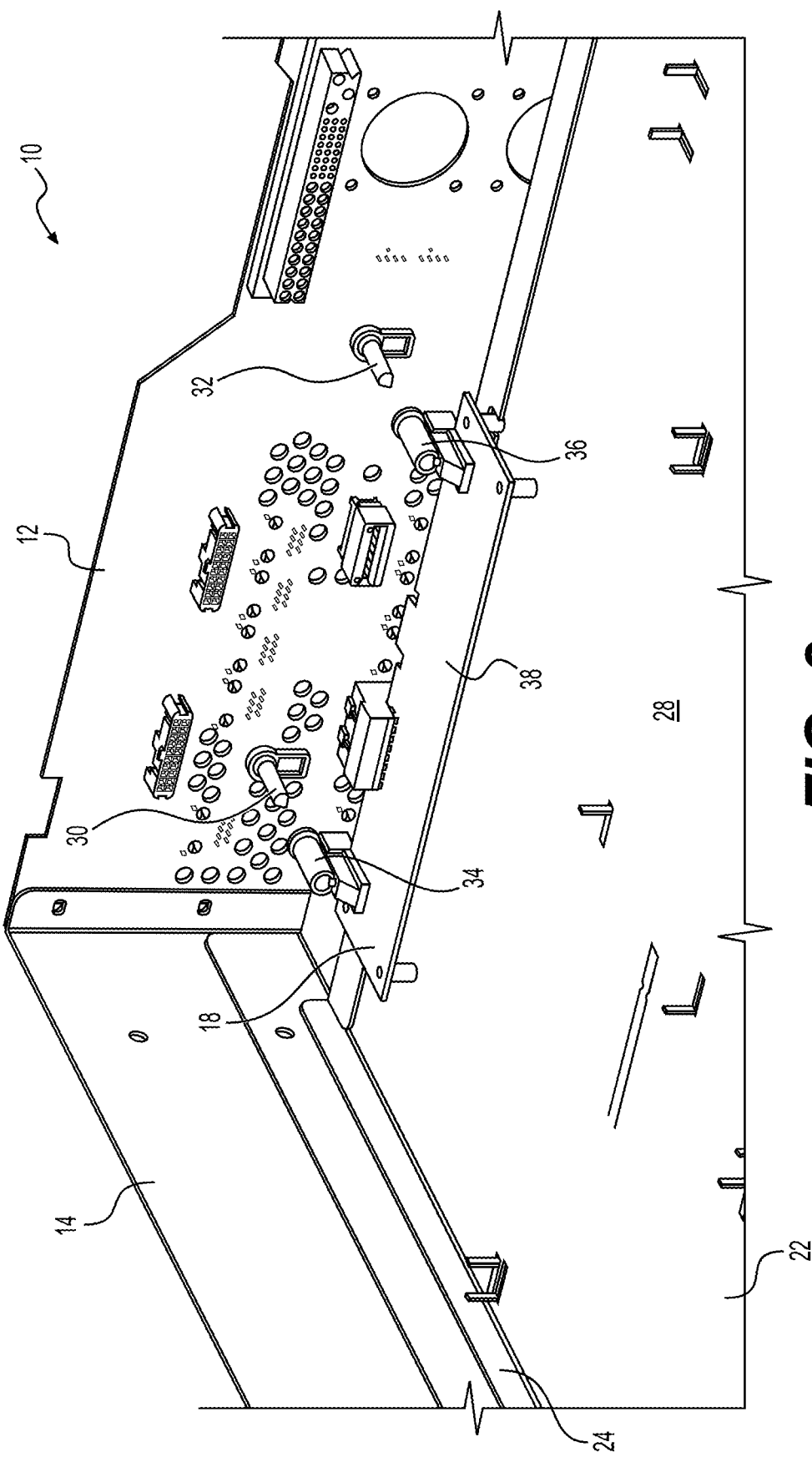
FIG. 2 is a perspective, detailed view of the rack of FIG. 1 with a partially inserted component in accordance with an embodiment of the present technology.
Figure 3:
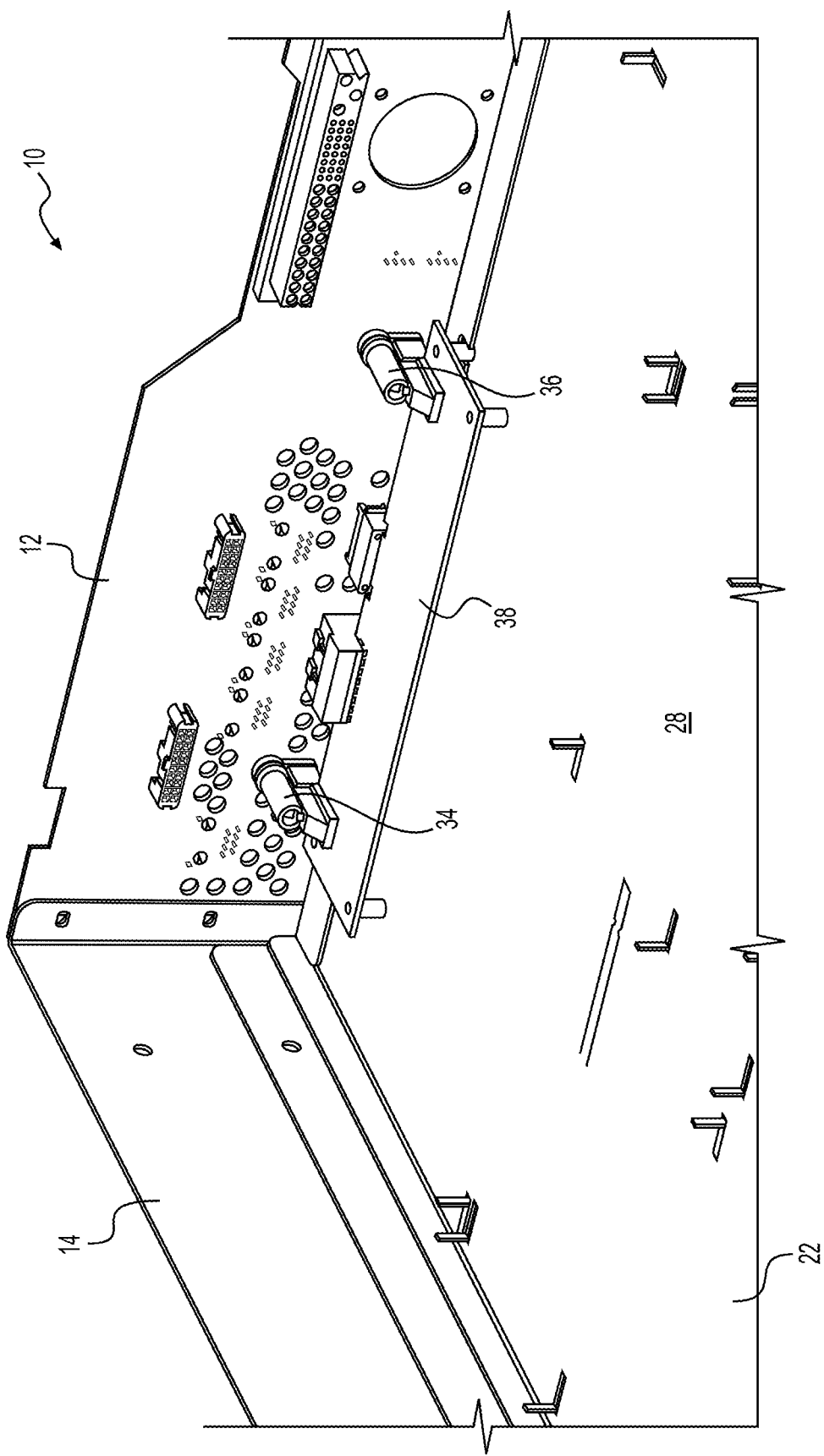
FIG. 3 is a perspective, detailed view of the rack of FIG. 1 with a fully inserted component in accordance with an embodiment of the present technology.

Referring now to the drawings, FIG. 1 is a perspective, exploded view of a rack 10 in accordance with an embodiment of the present technology. The rack 10 may for example be a 19-inch, standard-size rack having dimensions as defined in the EIA/ECA-310-E "Cabinets, Racks, Panels, And Associated Equipment" standard published by The Electronic Components Sector Of The Electronic Industries Alliance, December 2005. FIG. 2 is a perspective, detailed view of the rack 10 of FIG. 1 with a partially inserted component in accordance with an embodiment of the present technology. FIG. 3 is a perspective, detailed view of the rack 10 of FIG. 1 with a fully inserted component in accordance with an embodiment of the present technology. Referring at once to FIGS. 1, 2 and 3, the rack 10 comprises a backplane 12, a pair of side panels 14, 16 extending from the backplane 12, and support members 18, 20 mounted on each side panel 14, 16. Each support member 18, 20 is internal to the rack 10 and adapted to mate with a corresponding side edge 24, 26 of a component 22 that may be inserted in the rack 10. The component 22 is made of a main board 28 on which some electronic devices (not shown) are mounted. The support members 18, 20 mechanically guide an initial alignment of the component 22 upon initial insertion of the component 22 in the rack 10. Two male connectors 30, 32 mounted to the backplane 12 are configured to mate with two female connectors 34, 36 supported by a secondary board 38 that, in turn, is mounted to the rear of the main board 28 of the component 22. Mating of two male connectors 30, 32 with the two female connectors 34, 36 helps to mechanically guide a final alignment of the component 22 when the component is further inserted in the rack 10.

Though not illustrated, an additional pair of male connectors may be mounted on the backplane 12 and an additional pair of female connectors may be mounted on the secondary board 38, or on another secondary board, for redundancy purposes.

As illustrated, the two male connectors 30, 32 are defined in a plane parallel to the board 28 and perpendicular to the side panels 14, 18. Configurations in which two male connectors 30, 32 would be positioned vertically, one above the other, or defining an angle not parallel to a surface of the board 28, to mate with similarly positioned female connectors 34, 36, are also contemplated. As shown on FIG. 1, the rack 10 defines a plurality of parallel stages 40, each respective stage 40 being adapted for receiving a respective component 22. Each respective stage 40 includes respective support members 18, 20 mounted to the side panels 14, 16. Each respective support member is internally positioned in the rack 10 and adapted to mate with a corresponding side edge 24, 26 of the respective component 22 to mechanically guide an initial alignment of the respective component 22 upon initial insertion of the respective component 22 in the respective stage 40. Each respective stage 40 also includes a respective set of two male connectors 30, 32 mounted in the backplane 12 and configured to mate with two female connectors 34, 36 of the respective component 22 to mechanically guide a final alignment of the respective component 22 when the respective component 22 is further inserted in the rack 10. Without limitation, a vertical spacing between each of the plurality of parallel stages 40 may correspond to a standard-size rack unit (RU or "U"), for example having a height of 1.75 inches, as defined in the EIA/ECA-310-E standard.

The backplane 12 and the side panels 14 and 16 extend vertically and the support members 18, 20 are positioned so that each component 22 can be received in the rack 10 in a horizontal position. While the positioning of the backplane 12, side panels 14, 16 and components 22 complies with the conventional positioning of the EIA/ECA-310-E standard, the present disclosure is not so limited. For example, the side panels 14 and 16 could extend horizontally (becoming upper and lower panels), in which case the components 22 would extend vertically when received in the rack 10.

Figure 4:
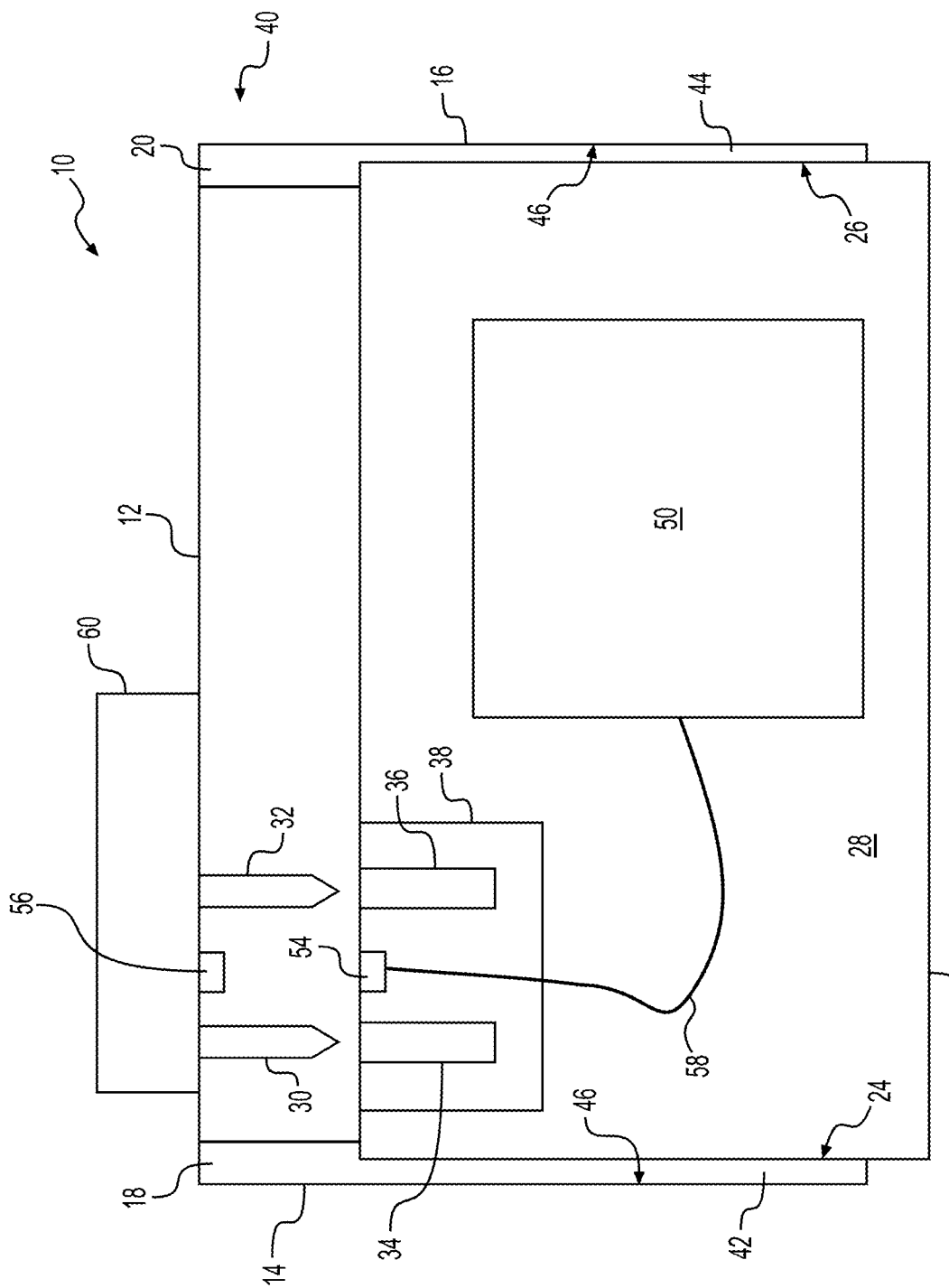
FIG. 4 is schematic top plan view of the rack of FIG. 1 with a partially inserted component in accordance with an embodiment of the present technology.
Figure 5:
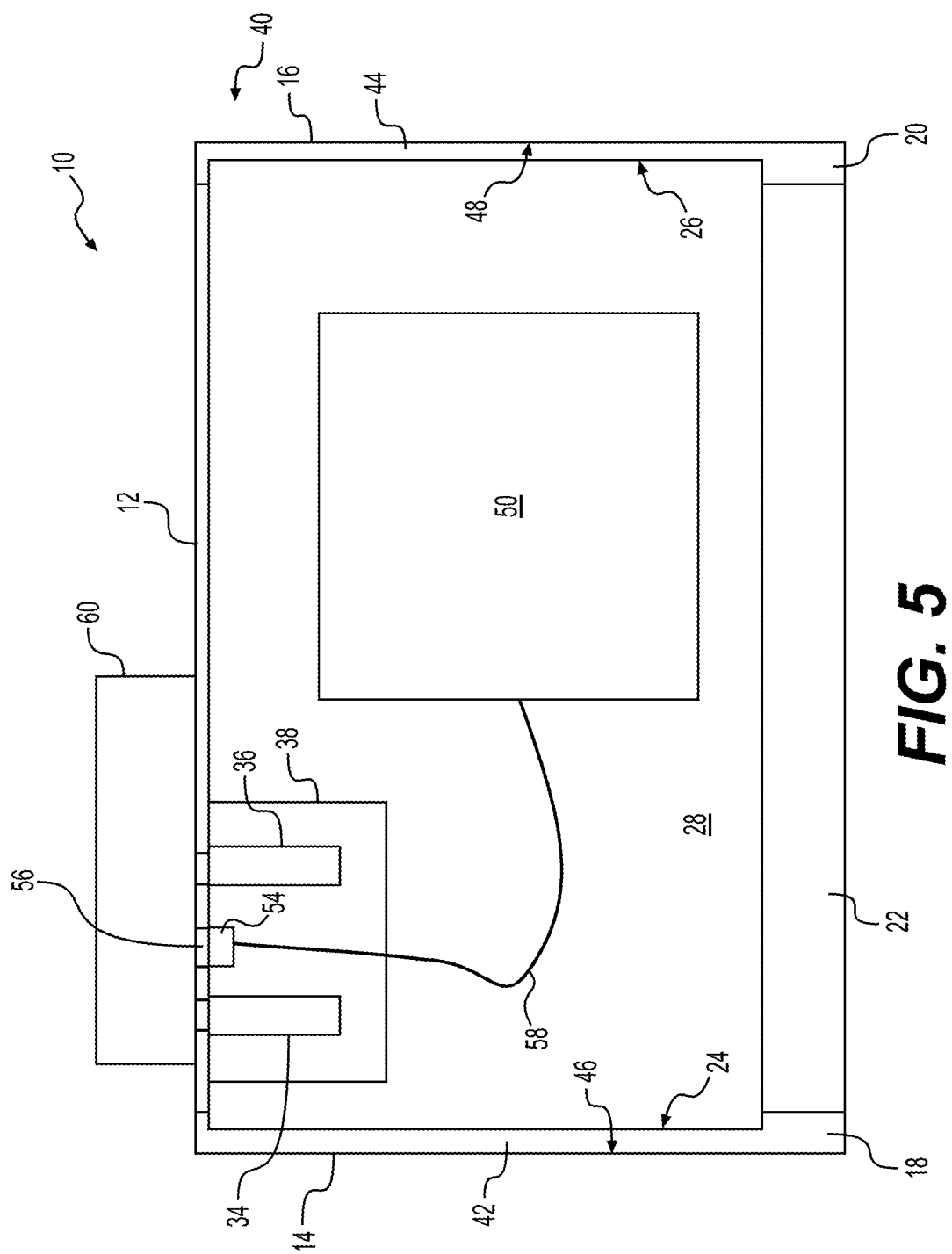
FIG. 5 is schematic top plan view of the rack of FIG. 1 with a fully inserted component in accordance with an embodiment of the present technology.

FIG. 4 is schematic top plan view of the rack 10 of FIG. 1 with the partially inserted component 22 in accordance with an embodiment of the present technology. FIG. 5 is schematic top plan view of the rack 10 of FIG. 1 with the fully inserted component 22 in accordance with an embodiment of the present technology. Referring at once to FIGS. 4 and 5, one stage 40 is illustrated; it is however understood that the rack 10 may include a plurality of parallel stages 40, as illustrated in FIG. 1, each parallel stage 40 being similarly constructed and including the same or equivalent respective elements as those shown on FIGS. 4 and 5.

FIGS. 4 and 5 are not to scale. In particular, the size of lateral gaps 42, 44 between the side edges 24, 26 of the board 28 and internal faces 46, 48 of the side panels 14, 16 are exaggerated for illustration purposes. Relative dimensions of the male connectors 30, 32 and of the female connectors 34, 36 and spacing between the two male connectors 30, 32 or between the two female connectors 34, 36, in view of general dimensions of the rack 10 and of the board 28, do not necessarily reflect an actual implementation.

FIGS. 4 and 5 reproduce several of the elements of FIGS. 1, 2 and 3 and further show a generic electronic component 50 (usually comprising a plurality of components) mounted on the board 28 of the component 22. The electronic component 50 may include, without limitation, any electronic component or group of components that performs processing functions, data storage functions, and like functions adapted for the purposes of the rack 10.

The backplane 12 is connected to a group 60 of electrical components, including for example an AC or DC power source (not shown) for the electronic component 50 as well as data processing devices (not shown). When the component 22 is partially inserted in the rack 10, an initial contact is established between at least one of the two male connectors 30, 32 and at least one of two female connectors 34, 36. This initial contact facilitates the alignment of the component 22 within the rack 10. A contactor 54 and a contactor 56 (FIGS. 4 and 5) are respectively mounted to the secondary board 38 and to the backplane 12. The electronic component 50 is connected to the contactor 54 via electric leads and a data connection (schematically encompassed in a connection 58 for simplicity) that may be implemented as wires or may be at least in part integrated within the board 28. When the component 22 is fully inserted in the rack 10, the contactors 54 and 56 come in contact with one another and thus provide electrical and data connections between the electronic component 50 and electrical components in the backplane 12.

In the embodiment of FIGS. 1 to 5, the female connectors 34, 36 mounted on the component 22 (either directly or on the secondary board 38) and the male connectors 30, 32 mounted on the backplane 12 facilitate the alignment of the component 22 when inserted in the rack 10. The male and female connectors do not necessarily support additional functions or features. In a variant of the present technology, additional connections between the component 22 and the backplane 12 are provided by fluidic ports for exchange of liquid (e.g. water) for cooling the rack 10 and, in particular but without limitation, for cooling equipment mounted behind the backplane 12. These ports include inlet and outlet ports mounted in the backplane 12, as well as feed and return ports that are part of a liquid connector mounted on the component 22.

In a first embodiment, the inlet and outlet ports may double as male connectors 30, 32 and the feed and return ports may double as female connectors 34 and 36, in which case no other component may be present to facilitate the alignment of the component 22 in the backplane 12. In a second embodiment, the inlet and outlet ports may be used as substitutes for one of the male connectors 30, 32 and the feed and return ports may be used as substitutes for one of the female connectors 34, 36. In that second embodiment, the liquid connector (including the feed and return ports) is mounted on the component 22 at a distance from another female connector also mounted on the component 22 while the inlet and outlet ports are mounted on the backplane 12 at a distance from another male connector also mounted on the backplane 12. In a third embodiment, male and female connectors as illustrated in FIGS. 1 to 5 are present in addition to the liquid connector.

Figure 6:
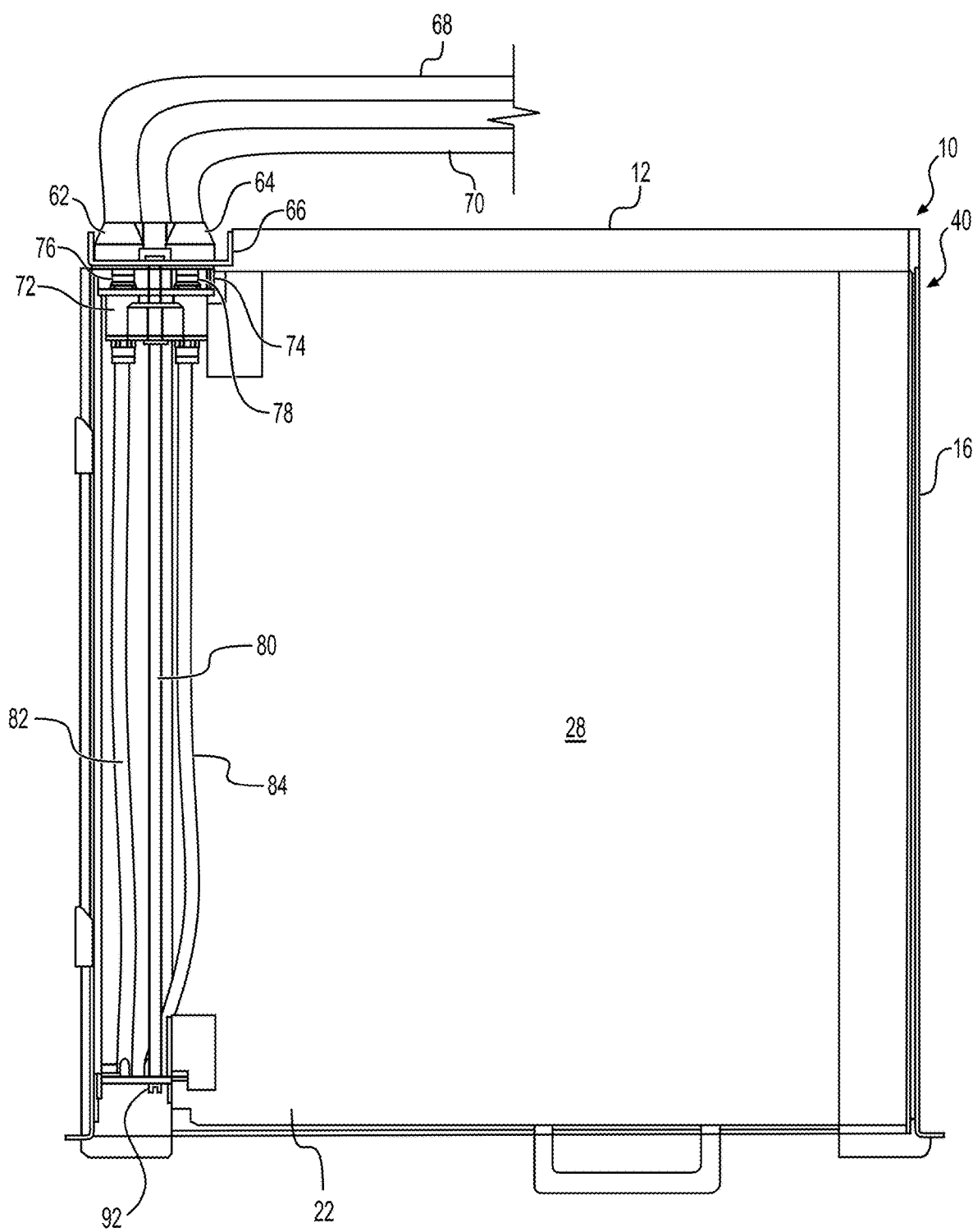
FIG. 6 is a top plan view of a variant of a component insertable in the rack of FIG. 1, the component providing a fluidic connection for cooling purposes.

FIG. 6 is a top plan view of a variant of a component 22 insertable in the rack 10 of FIG. 1, the component 22 providing a fluidic connection for cooling purposes. FIG. 6 illustrates the above-mentioned, non-limiting first embodiment in which the inlet and outlet ports double as male connectors 30, 32 while the feed and return ports double as female connectors 34 and 36. In this variant, a male inlet port 62 and a male outlet port 64 are mounted on a section 66 of the backplane 12. The inlet port 62 is connected to a "cold" inlet tube 68 mounted behind the backplane 12 for distributing liquid, for example water, for cooling of equipment mounted in the rack 10. The liquid returns to the outlet port 64 via a "hot" outlet tube 70. A liquid adaptor 72 is mounted on the component 22, proximally to a rear edge 74 of the component 22. The liquid adaptor 72 comprises a female feed port 76, a female return port 78, and an elongate rod 80 that extends at one end between the feed and return ports 76, 78 and at another end to a front of the component 22. The feed port 76 and the return port 78 are respectively adapted for mating with the inlet port 62 and with the outlet port 64 when the component 22 is inserted in the rack 10. Operation of the elongate rod 80 is described hereinbelow. A "cold" feed tube 82 is connected to the feed port 76 and extends to the front of the component 22. A "hot" return tube 84 is connected to the return port 74 and also extends to the front end of the component 22. When the component 22 is fully installed, cooling liquid may be injected via the feed tube 82 and reach the inlet tube 82, the liquid returning to the return tube 84 via the outlet tube 70.

Figure 7:
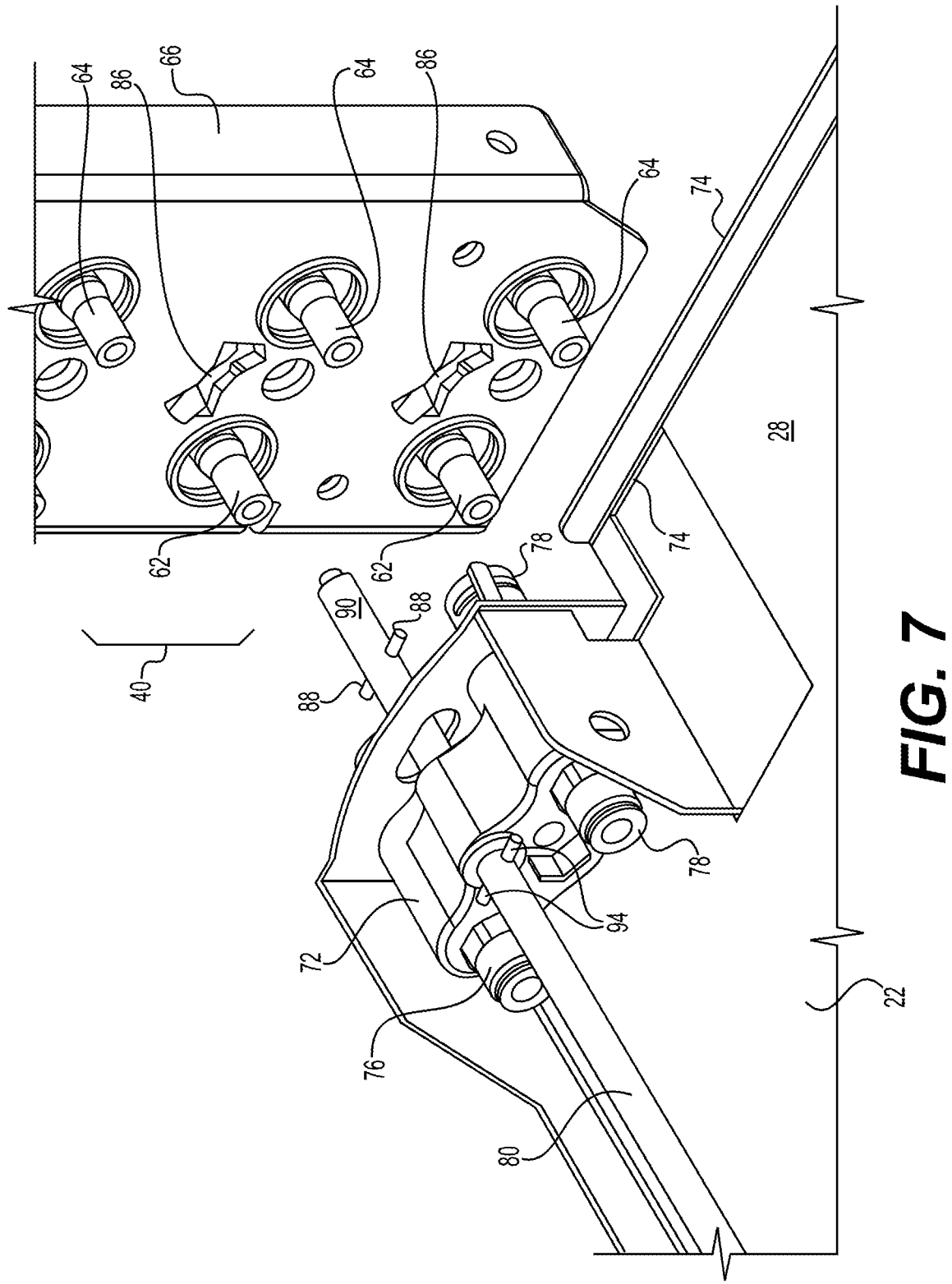
FIG. 7 is a perspective, detailed view of the component of FIG. 6 partially inserted in a rack in accordance with an embodiment of the present technology.
Figure 8:
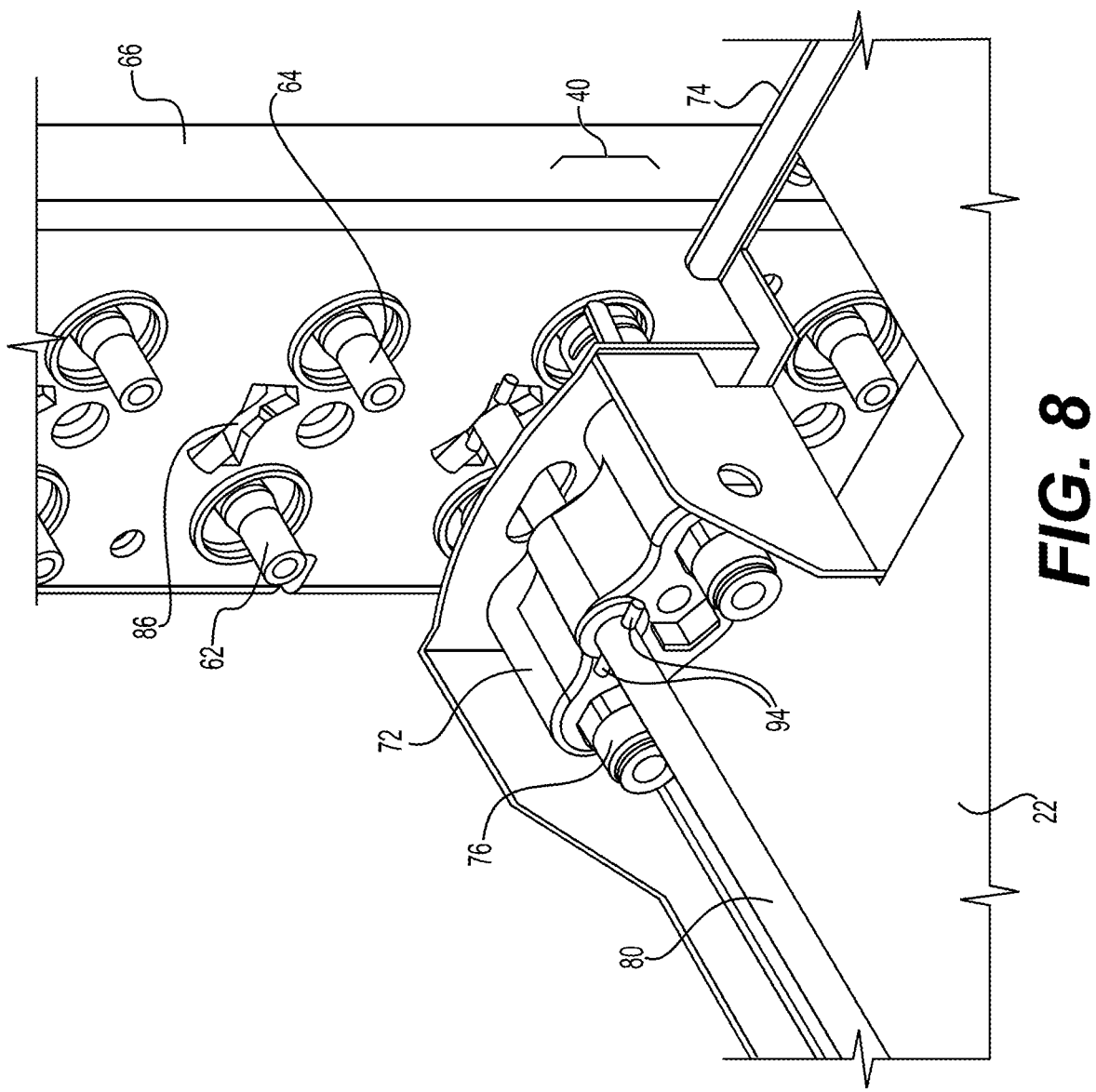
FIG. 8 is a perspective, detailed view of the component of FIG. 6 being substantially fully inserted in the rack in accordance with an embodiment of the present technology.
Figure 9:
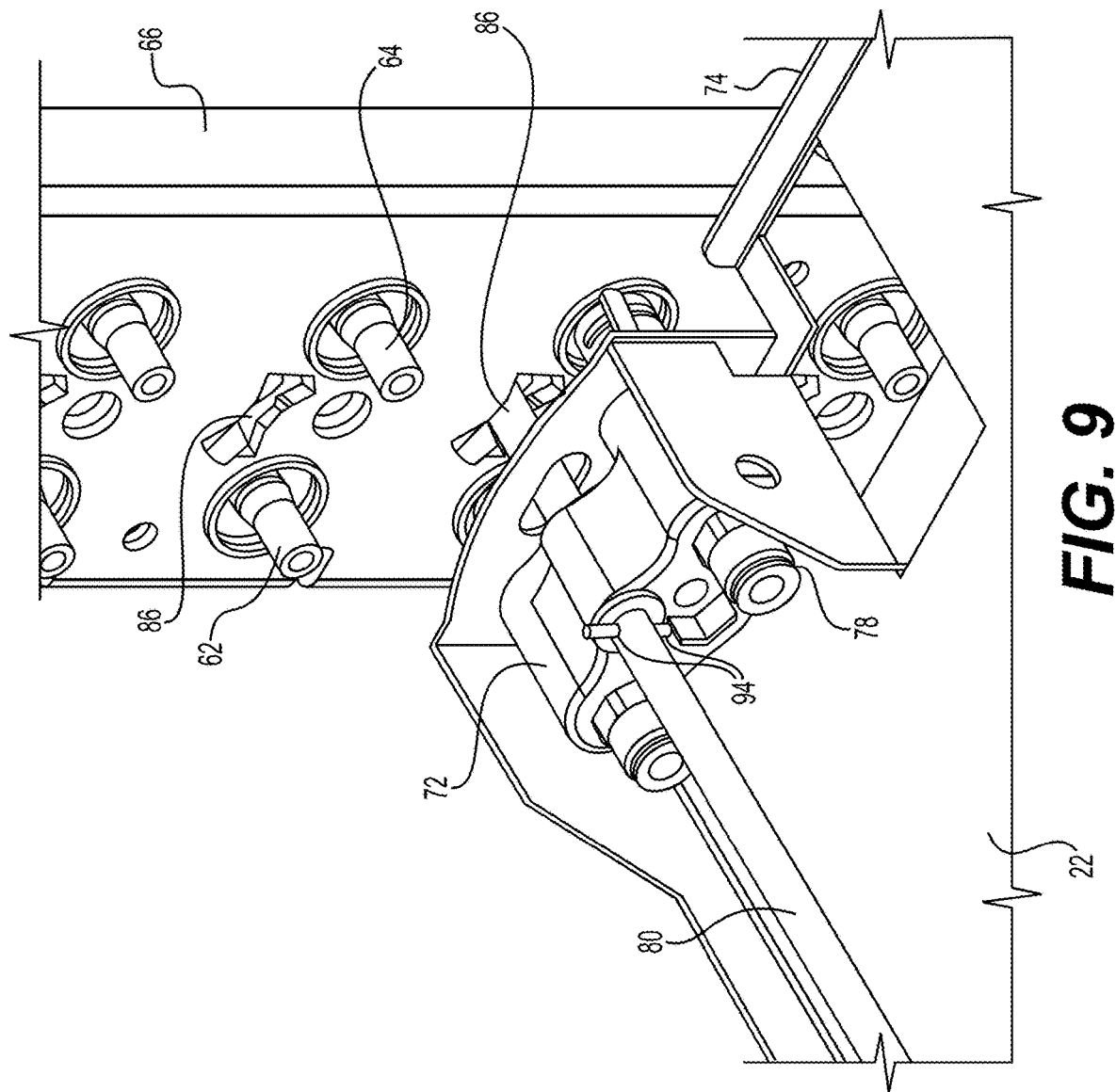
FIG. 9 is a perspective, detailed view of the component of FIG. 6 being fully inserted and locked in the rack in accordance with an embodiment of the present technology.

FIG. 7 is a perspective, detailed view of the component 22 of FIG. 6 partially inserted in the rack 10 in accordance with an embodiment of the present technology. FIG. 8 is a perspective, detailed view of the component 22 of FIG. 6 being substantially fully inserted in the rack 10 in accordance with an embodiment of the present technology. FIG. 9 is a perspective, detailed view of the component 22 of FIG. 6 being fully inserted and locked in the rack 10 in accordance with an embodiment of the present technology. The various tubes of FIG. 6 omitted on FIGS. 6 to 9 in order to simplify the illustration. Referring at once to FIGS. 6 to 9, an inlet port 62 and an outlet port 64 are mounted in each stage 40 on the section 66 of the backplane 12. A slot 86 is formed in each stage 40 of the backplane 12. Each slot 86 is proximal to a corresponding inlet port 62 and to a corresponding outlet port 64. The slot 86 located on a given stage 40 forms an attachment point for the liquid adaptor 72 located on a component 22 that is on the same stage 40 of the rack 10. As illustrated, a center of the inlet port 62, a center of the outlet port 64 and a center of the slot 86 on the same stage 40 generally form a flat triangle. The slot 86 may alternatively be positioned between the corresponding inlet and outlet ports 62, 64. The elongate rod 80 has lateral extensions 88, such as pins, on an end section 90 of the elongate rod 80 that protrudes beyond the rear edge 74 of the component 22, the feed port 76 and the return port 78.

It may be noted that the pair formed by the inlet port 62 and the feed port 76 is interchangeable with the pair formed by the outlet port 64 and the return port 78. In fact, the hot and cold tubes may be connected to any one of the ports as long as consistency is maintained between these connections and a cooling system (not shown) of the rack 10.

A front end 92 of the elongate rod 80 opposite from the end section 90 is configured for receiving a rotating motion from a connectable handle, a screwdriver, or like tool (not shown). The elongate rod 80 is rotated, for example manually, for aligning the lateral extensions 88 with the slot 86 prior to full insertion of the component 22 in the rack 10, substantially as illustrated on FIG. 7. FIG. 8 shows that the end section 90 and the lateral extensions 88 have been inserted via the slot 86 within the backplane 12. The elongate rod 80 has not yet been rotated further from its position on FIG. 7, as evidenced by the orientation of pins 94 that remains unchanged between FIGS. 7 and 8. FIG. 9 shows that the elongate rod 80 is rotated about a quarter of a turn, as evidenced by the different orientation of the pins 94. The rotation of the elongate rod 80 places the lateral extensions 88 out of alignment with the slot 86 after full insertion of the component 22 in the rack 10. This causes the lateral extensions 88 to abut on a face (not shown) of the backplane 12 opposite from the component 22 to maintain the liquid adaptor 72 in place. There may be a slight movement of the component 22 in relation to the backplane 12 between FIGS. 8 and 9, the liquid adaptor 72 and the rear edge 74 of the component 22 being brought slightly closer to the backplane 12 on FIG. 9. This movement is caused by a pressure applied on the liquid adaptor 72 by the pins 94 when the lateral extensions 88 are slightly pulled inward of the backplane 12 by the displacement of the elongate rod 80 on the face of the backplane 12 opposite from the component 22. This movement has at least a double effect, in which the component 22 is held firmly in place in the rack 10 while, in addition, watertight connections are established between the inlet port 62 and feed port 76 and between the outlet and return ports 64, 78. It may be noted that seals (not shown) such as for example Teflon™ or rubber rings may be provided to prevent leakage at the connections between the various ports.

In some applications, the connections of the female feed and return ports 76, 78 of the liquid adaptor 72 to the male inlet and outlet ports 62, 64 mounted on the section 66 of the backplane 12 may suffice to provide proper alignment of the component 22 in the rack 10. Alternatively, an embodiment of the rack 10 may include at once the male connectors 30, 32 and the female connectors 34, 36 as illustrated on FIG. 1-5, along with the liquid adaptor 72 as illustrated on FIG. 6. Another embodiment may include a single male connector 30 mounted on the backplane 12 and a single female connector 34 cooperating with the liquid adaptor 72 and the inlet and outlet ports 62, 64 to provide proper alignment of the component 22 in the rack 10.

Figure 10:
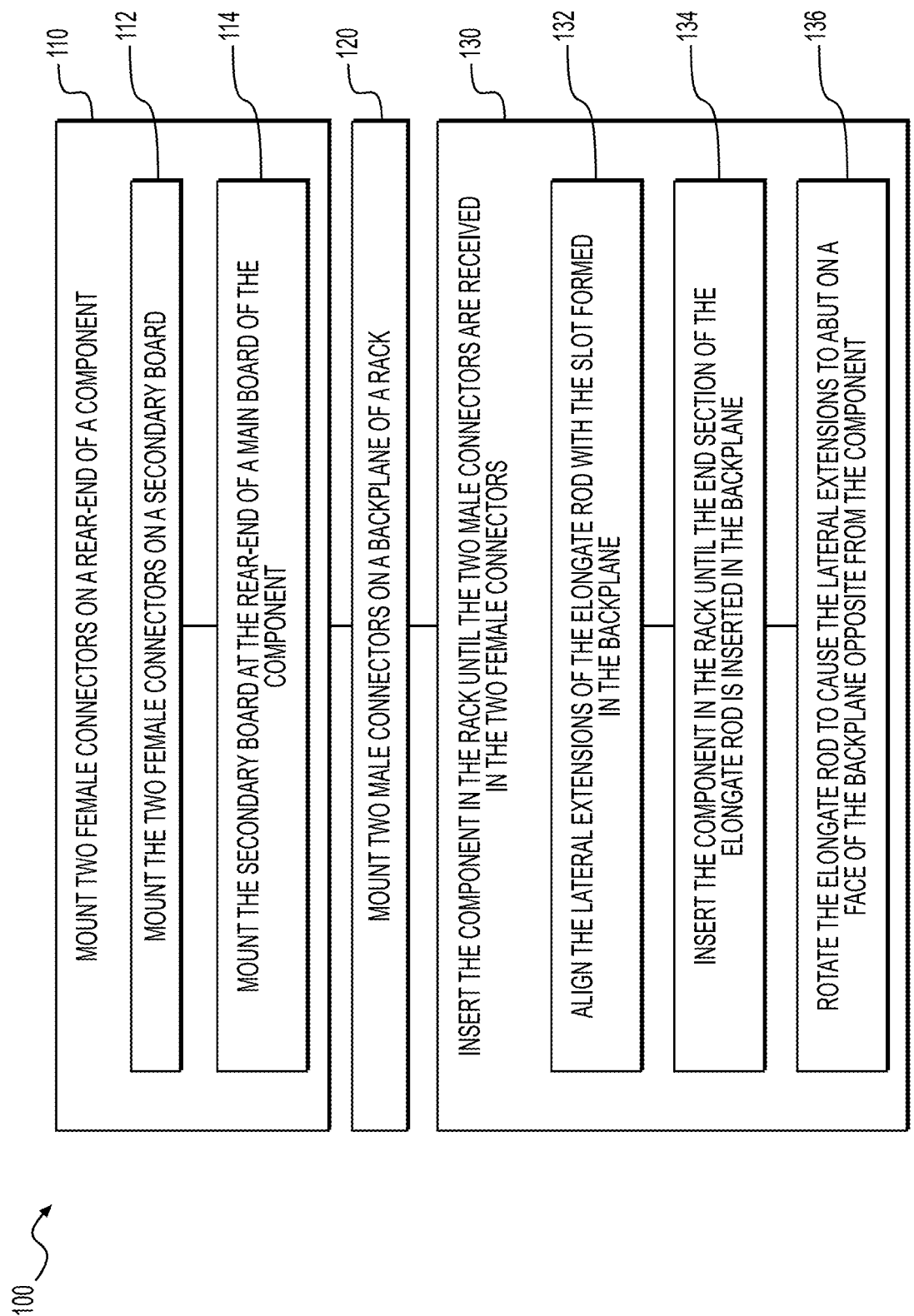
FIG. 10 is a sequence diagram of a method of mounting a component in a rack in accordance with an embodiment of the present technology.

FIG. 10 is a sequence diagram of a method of mounting a non-standard component in the rack 10 in accordance with an embodiment of the present technology. On FIG. 10, a sequence 100 comprises a plurality of operations that may be executed in variable order, some of the operations possibly being executed concurrently, some of the operations being optional. In the sequence 100, operation 110 comprises mounting the two female connectors 34, 36 on a rear end of the component 22. In this operation 110, the two female connectors 34, 36 may be mounted directly on the component 22. Alternatively, operation 110 may comprise sub-operation 112 that includes mounting the two female connectors 34, 36 on a secondary board 38, and sub-operation 114 that includes mounting the secondary board 38 at the rear end of the main board 28 of the component 22. At operation 120, the two male connectors 30, 32 are mounted on the backplane 12 of the rack 10.

At operation 130, the component 22 is inserted in the rack 10 until the two male connectors 30, 32 are received in the two female connectors 34, 36. If at least one of the two male connectors 30, 32 comprises the inlet and outlet ports 62, 64, in which case a corresponding at least one of the two female connectors 34, 36 comprises the feed and return ports 76, 78, operation 130 may comprise sub-operations 132, 134 and 126. At sub-operation 132, the lateral extensions 88 of the elongate rod 80 are substantially aligned with the slot 86 formed on the backplane 12. At sub-operation 134, the component 22 is inserted in the rack 10 until the end section 90 of the elongate rod 80 is inserted in the backplane 12. At sub-operation 136, after full insertion of the component 22 in the rack 10, the elongate rod 80 is rotated for placing the lateral extensions 88 out of alignment with the slot 86 to cause the lateral extensions to abut on the face of the backplane 12 opposite from the component 22 to maintain the component 22 inserted in the rack 10.

Figure 11:
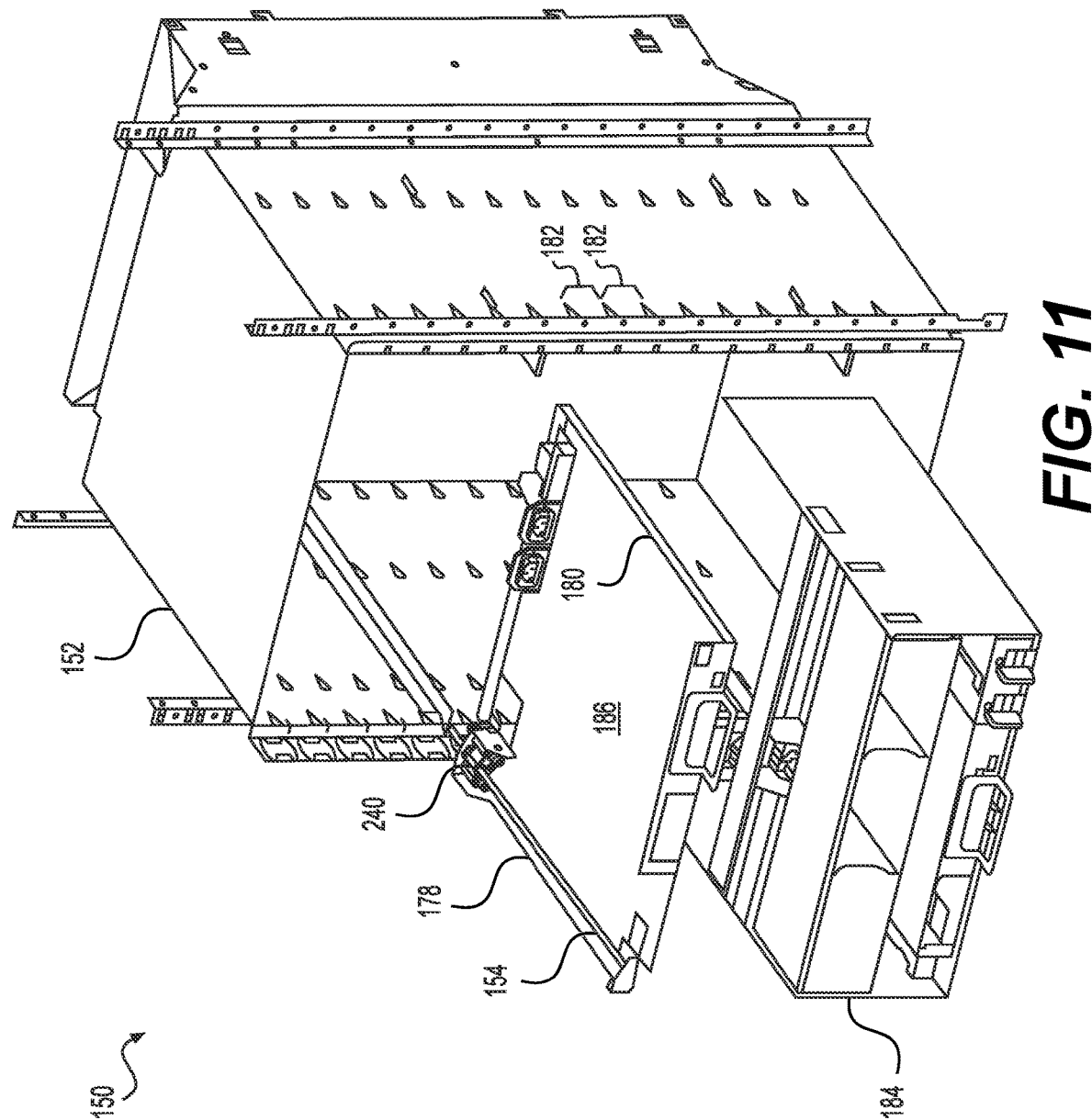
FIG. 11 is a front perspective view of a system comprising a rack in which support members are inserted and at least one insertable component in accordance with an embodiment of the present technology.

FIG. 11 is a front perspective view of a system 150 comprising a rack 152 and at least one insertable component 154. The rack 152 may for example be a 19-inch, standard-size rack having dimensions as defined in the EIA/ECA-310-E "Cabinets, Racks, Panels, And Associated Equipment" standard published by The Electronic Components Sector Of The Electronic Industries Alliance, December 2005.

In the present description of the rack 152, the component 154 are introduced at the front of the rack 152; and left and right sides of the rack 152, of the component 154, and of their various parts are defined from the perspective of a viewer positioned in front of the rack 152. Also, while a rack may be configured for vertical insertion of components, the present disclosure describes a configuration in which the components 154 are insertable in a horizontal configuration within the rack 152. These considerations are made for simplification purposes and for a better understanding of terms such as 'horizontal', 'vertical', 'front', 'rear', 'left' and 'right', without limiting the generality of the present disclosure.

The component 154 includes a liquid connector adapted for mating with a liquid connector mounted on a support member 156 (FIG. 12) mountable on the rack 152. In an embodiment, the liquid connectors mounted on the support member 156 and on the component 154 may comprise conventional quick-connect fluidic adaptors that may come in contact and mate when the support member 156 and the component 154 are both fully inserted in the rack 152. Particular embodiments of the liquid connectors will be described in greater details herein further below. The component 154 also includes a main board 186 on which some heat-generating units 900 (FIG. 19) may be mounted. The liquid connectors may be configured for providing liquid cooling to said heat-generating units 900. In an embodiment, the rack 152 may be a server rack and the insertable component 154 housed thereby may be a server module or a related functional module (e.g., networking, hard-disk drives, or power supply module).

Figure 12:
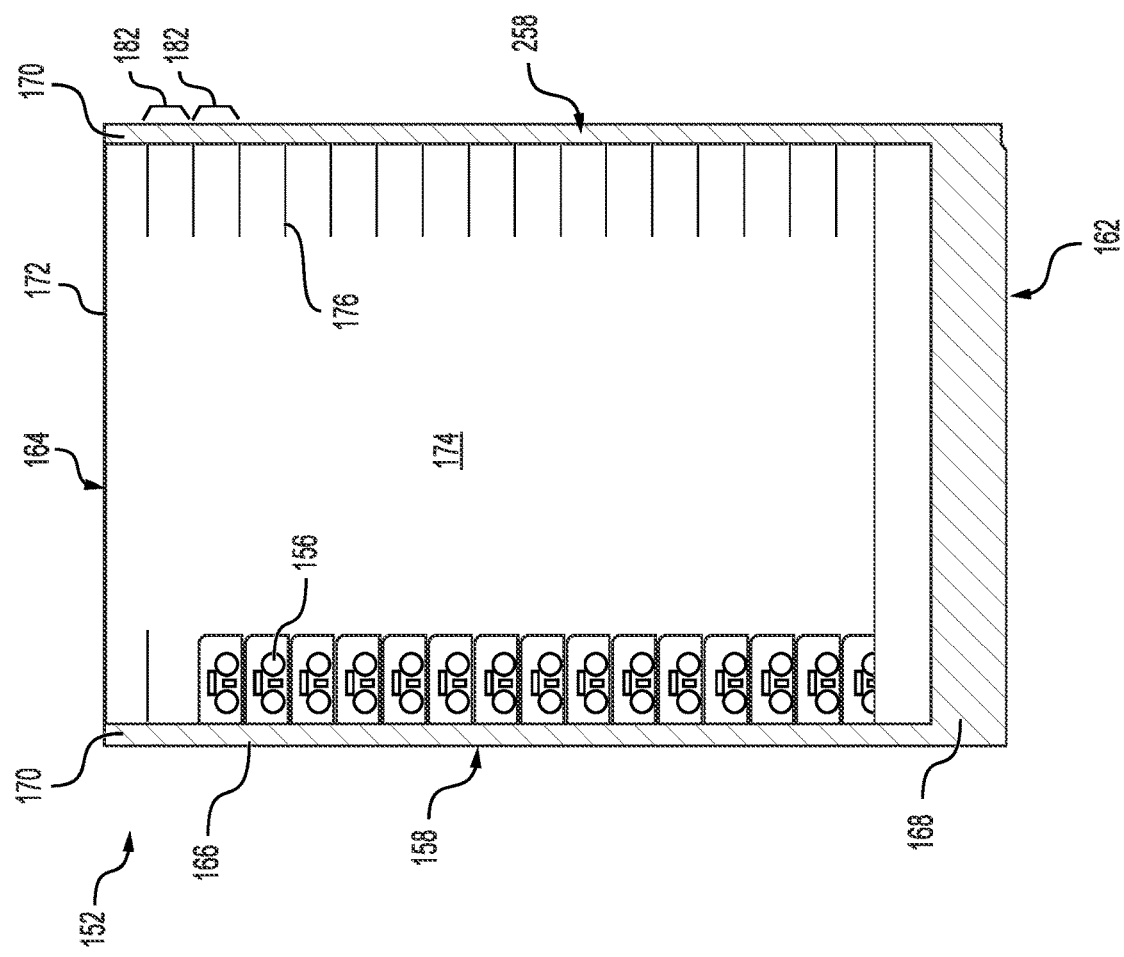
FIG. 12 is a front elevation view of the rack of FIG. 11 in accordance with an embodiment of the present technology.

FIG. 12 is front elevation view of the rack 152 in which support members 156 are inserted. Referring at once to FIGS. 11 and 12, the rack 152 has a left lateral end 158 and a right lateral end 160 which are opposite one another in the lateral direction. As can be seen, in this embodiment, the rack 152 has a width, measured between the lateral ends 158, 160, that is less than a height thereof, measured between a lower end 162 and an upper end 164 of the rack 152. As such, the rack 152 can be said to be vertically-extending rather than vertically-extending. It is contemplated that the rack 152 could be horizontally-extending in other embodiments.

A frame 166 of the rack 152 has a base 168 defining a bottom portion of the rack 152. In this embodiment, the frame 166 has a plurality of generally rectangular vertical walls fastened to the base 168 and extending upwardly therefrom. The vertical walls are mounting panels 170 for supporting the support members 156 and the components 154. An upper frame member 172 extends parallel to the base 168 and defines at least in part the upper end 164 of the rack 152. Notably, the upper frame member 172 is a generally planar sheet metal component that is fastened to the upper ends of the mounting panels 170. Two or more of the mounting panels 170 are laterally spaced from one another so as to define one or more housing sections 174 therebetween in which at least one insertable component 154 can be housed. In the embodiment of FIGS. 11 and 12, the frame 166 includes two mounting panels 170 which define one housing section 174. The rack 152 may define one or more housing sections 174 in alternative embodiments (e.g., three housing sections 174 in some embodiments). For simplification purposes and without limiting the generality of the present disclosure, the remainder of the description will describe a single housing section 174 defined by two mounting panels 170.

The rack 152 comprises left and right support members 156 and 176 that mechanically guide an initial alignment of the component 154 upon initial insertion of the component 154 in the rack 152 and support the component 154 within the housing section 174. As will be described in greater detail below, each mounting panel 170 defines a plurality of mounts onto which the left and right support members 156 and 176 can be mounted. Each left support member 156 correspond to one of the right support members 176, thereby forming pairs of support member 156, 176, the left and right support members 156, 176 of a pair being horizontally aligned when mounted in the rack 152. In this embodiment, the left and right support members 156, 176 are internal to the rack 152 and adapted to mate with a corresponding side edge 178, 180 of the component 154 that may be inserted in the rack 152. The left and right support members 156, 176 are described in greater details herein below.

The rack 152 comprises a plurality of vertically distributed, parallel rack stages 182. Each rack stage 182 is adapted to receive a distinct component such as the component 154. The main board 186 may be a standard-size board, for example a 19-inch board. Each rack stage 182, or position, may occupy a standard-size rack unit "U" defined in the vertical direction. A height of the shown component 154 is adapted to fit in a single rack stage, the height of the component 154 not exceeding the unit U. Each rack stage 182 is adapted to receive a distinct component when each of those components has a height that does not exceed the rack unit U. Another component 184 occupies a plurality rack stages 182 when inserted in the rack 152, as best shown in FIG. 11.

Figure 13:
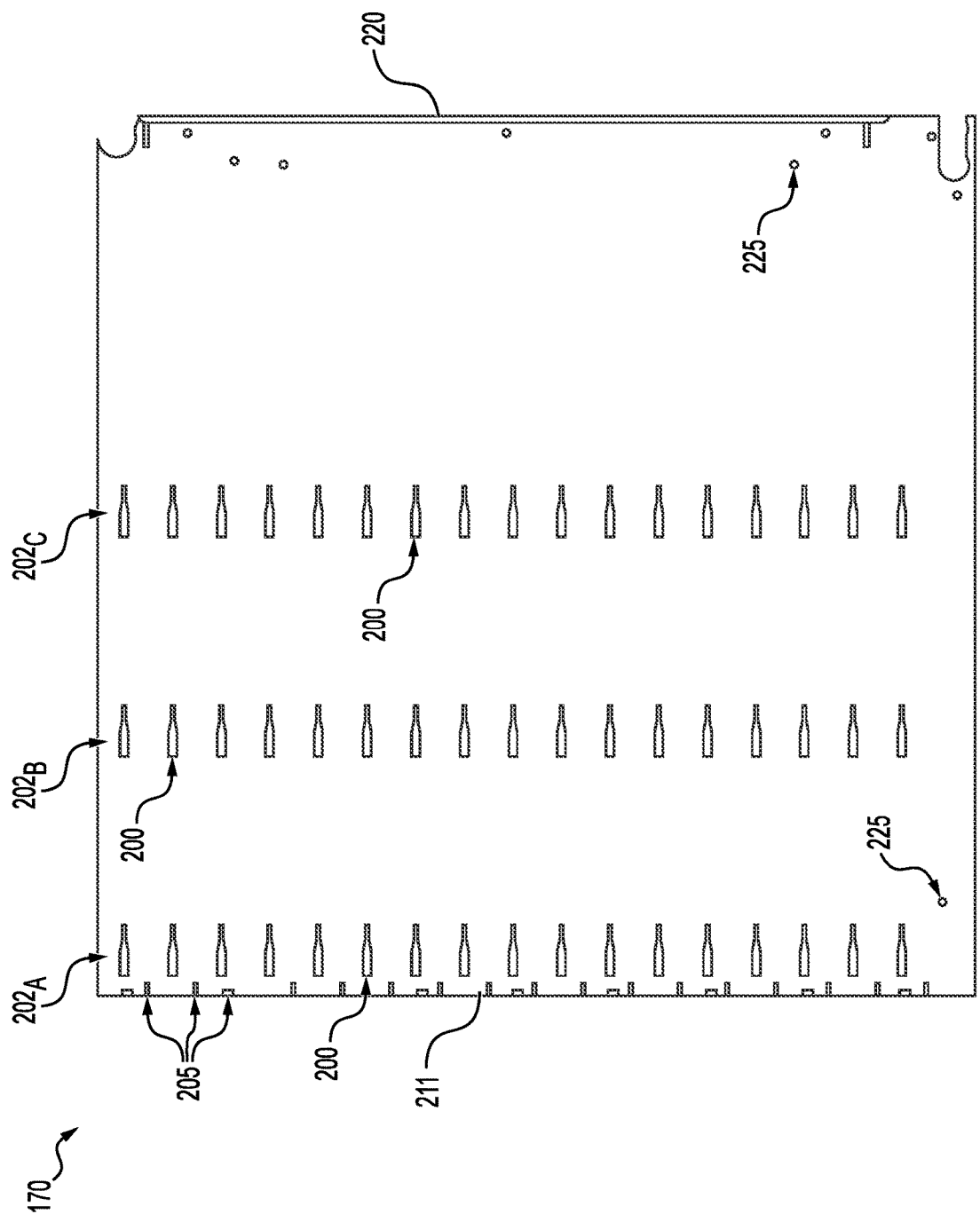
FIG. 13 is a right side elevation view of a left mounting panel of the electronic equipment rack of FIG. 11 in accordance with an embodiment of the present technology.
Figure 17:
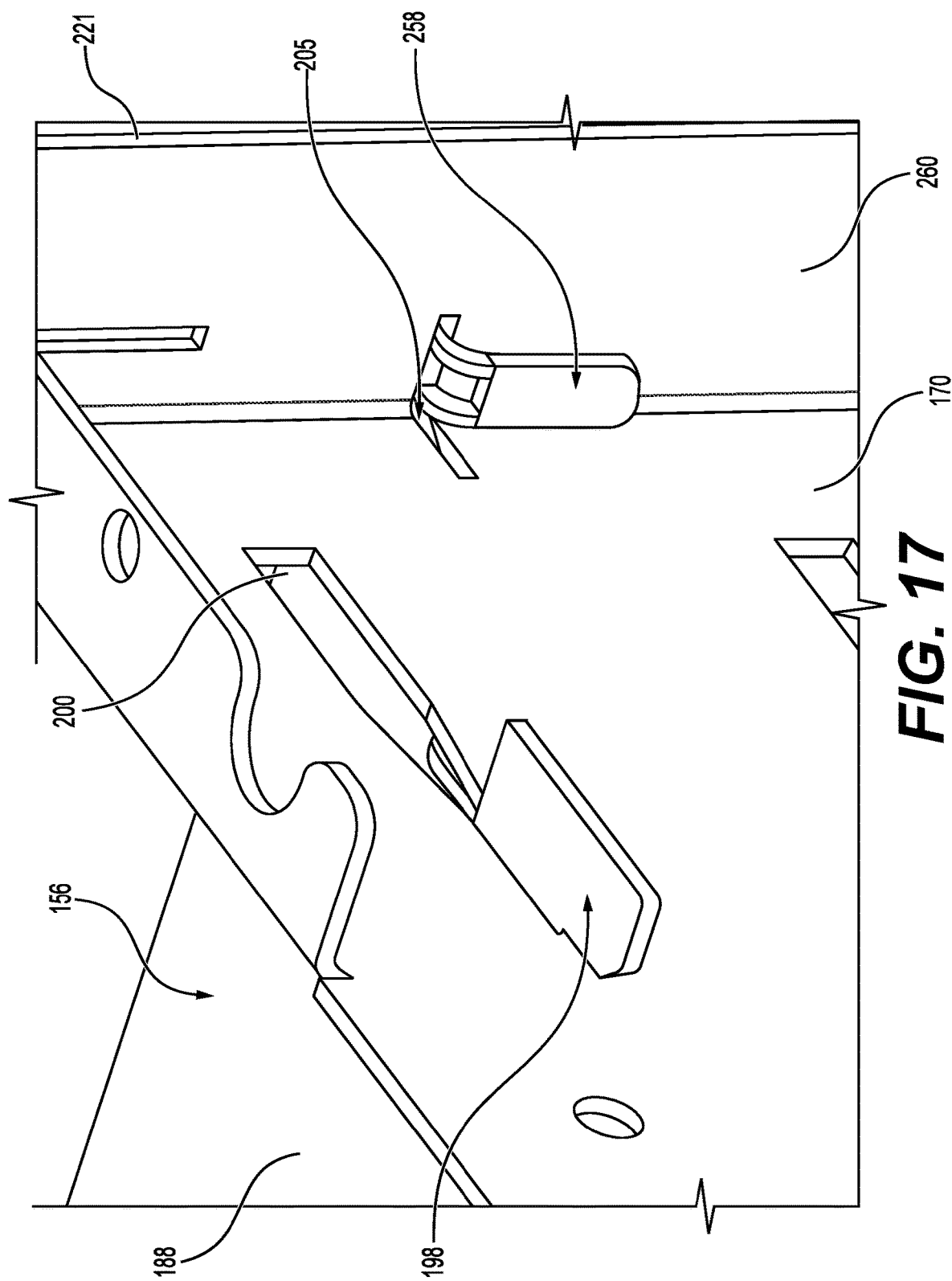
FIG. 17 is a perspective view, taken from a top, rear, left side, of the left mounting panel of FIG. 13 with the left support member of FIG. 15 connected thereto in accordance with an embodiment of the present technology.

FIG. 13 illustrates one of the mounting panels 170, namely a left mounting panel 170 defining a left side of one of the housing sections 174, the left mounting panel 170 being viewed from inside the housing section 174. The mounting panel 170 extends along a depth of the rack 152 from a front end 211 to a rear end 220. In this embodiment, as best shown in FIG. 17, the front end 211 of the mounting panel 170 comprises a vertically-extending front portion 221 extending perpendicularly to the mounting panel 170. Right mounting panels 170 defining the right sides of the housing sections 174 are a mirror image of the left mounting panel 170 of FIG. 13. Therefore, only the left mounting panel 170 will be described in detail herein. It is to be understood that the same description applies to the right mounting panel 170.

The mounting panel 170 has a plurality of rack mounting features for mounting the left support members 156 to the rack 152. The mounting panel 170 also defines, at each rack stage 182, an opening 205 extending though a portion of the vertically-extending front portion 221 for receiving a tab 258 (FIGS. 15 and 17) of a corresponding left support member 156. The mounting panel 170 also defines fastener openings 225 distributed over the mounting panel 170 through which fasteners (e.g., bolts) may be inserted to connect the mounting panel 170 to another one of the mounting panels 170 of the rack 152. For example, the left mounting panel 170 illustrated on FIG. 13 may be connected to a right mounting panel of an adjacent housing section 174 of the rack 152.

In this embodiment, the rack mounting features are apertures 200 formed on the mounting panel 170. The apertures 200 are distributed in three distinct columns $202_A$, $202_B$, $202_C$ of apertures 200 that are spaced from one another in the depth direction of the rack 152. Apertures 200 of a given rack stage 182 are disposed along a common horizontal axis, so that one aperture 200 of each of the front, middle and rear columns $202_A$, $202_B$ and $202_C$ define a set of apertures 200 for receiving a support member 156 or 176 in the given rack stage 182. The mounting panel 170 may comprise additional rows and/or columns of apertures 200 in other embodiments.

Figure 14:
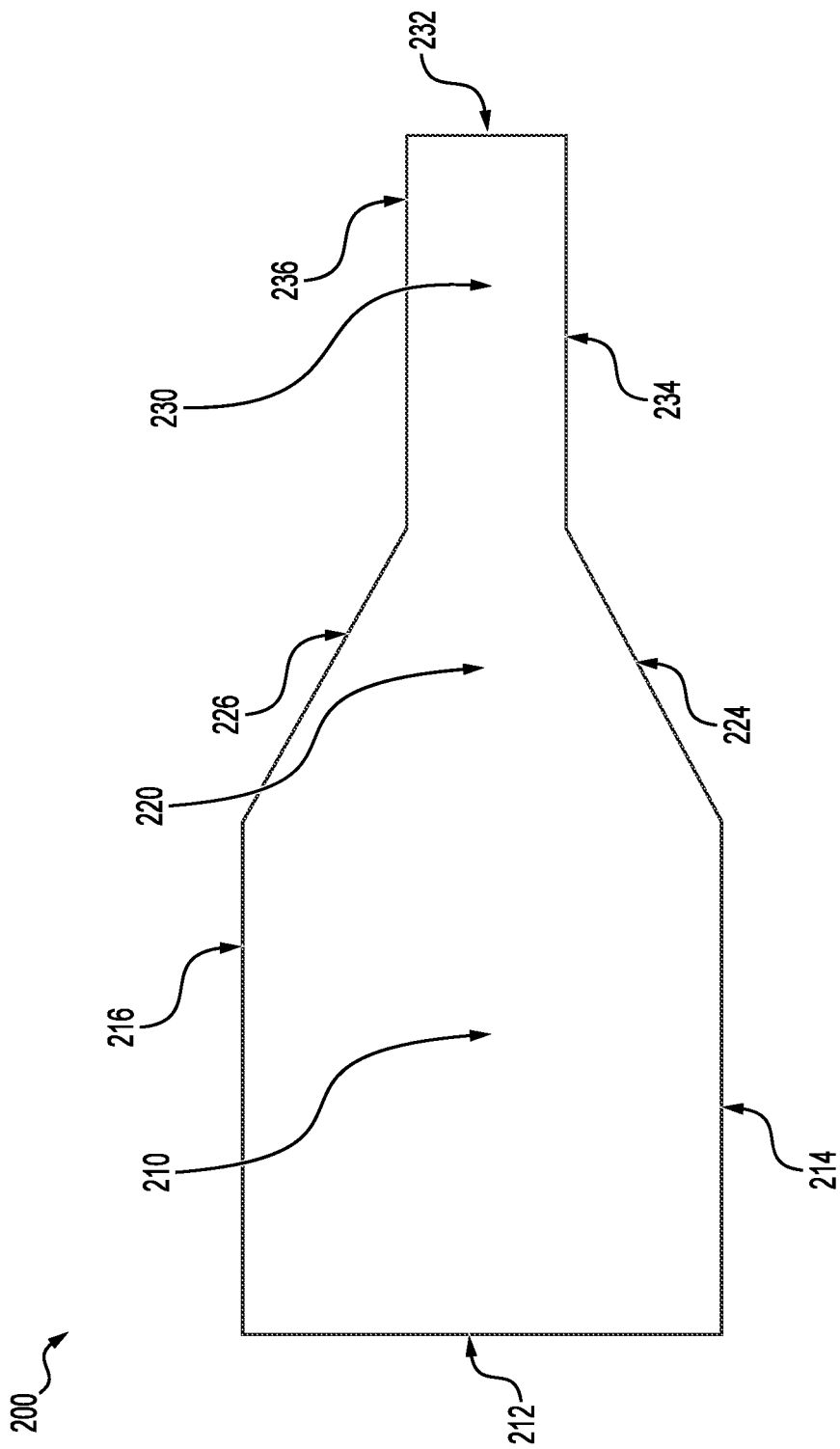
FIG. 14 is a right side elevation view of a rack mounting feature of the left mounting panel of FIG. 13 in accordance with an embodiment of the present technology.

As shown in FIG. 14, in this embodiment, each aperture 200 extends from a front end 212 to a rear end 232. The aperture 200 has an enlarged portion 210, a reduced portion 230 and a transition portion 220 extending between the enlarged and reduced portions 210, 230. The enlarged portion 210 has a first height measured between a lower end 214 and an upper end 216, while the reduced portion 230 has a second height measured between a lower end 234 and an upper end 236. As can be seen, the second height of the reduced portion 230 is less than the first height of the enlarged portion 210. A height of the transition portion 220, measured between a lower end 224 and an upper end 226, decreases along a span thereof in the depth direction of the rack 152 (i.e., from the front to the rear of the aperture 200) from the enlarged portion 210 to the reduced portion 230. FIG. 14 is not to scale; sizes of vertical aspects of the aperture 200 are exaggerated in comparison to sizes of horizontal aspects for illustration purposes.

Since the right mounting panel 170 of a given housing section 174 is a mirror image of the left mounting panel 170, the apertures 200 of the left mounting panel 170 of the given housing section 174 are disposed at a same height as the corresponding apertures 200 of the right mounting panel 170 of the given housing section 174 such that, in use, a given component 154 may be mounted in a given rack stage 182 within the housing section 174 between the left and right mounting panels 170 using two sets of apertures 200.

A left support member 156 will now be described with reference to FIG. 15. The left support member 156 is mountable on the left mounting panel 170 of the rack 152.

In this embodiment, the left support member 156 comprises a horizontally-extending portion 188, or "elongate plate" 188, extending from a front end 248 to a rear end 252 between left and right lateral ends 194, 196. The left support member 156 extends in the depth direction of the rack 152 such that, in use, the front end 248 is located proximate the front end 211 of the mounting panel 170 while the rear end 252 is located proximate the rear end 220 of the mounting panel 170. The left support member 156 also has a vertically-extending portion 244 extending from the left lateral end 194 of the horizontally-extending portion 188 at a right angle and defining an internal side surface $244_1$ and an external side surface $244_2$. In this embodiment, the left support member 156 has three connector legs 198 extending from the vertically-extending portion 244. Each of the connector legs 198 is configured to engage with a respective aperture 200 of the corresponding mounting panel 170 to connect the left support member 156 to the rack 152. In this embodiment, the connector legs 198 extend laterally from a top end 246 of the vertically-extending portion 244 and at a right angle from the vertically-extending portion 244. In other embodiments, the number of connector legs 198 may vary, and the number of apertures 200 may be at least equal to, or greater than, the number of connector legs 198. For example, the support member 156 may include two connector legs 198 for insertion in two of the three apertures 200 of a given rack stage 182. Although distances between columns $202_A$ and $202_B$ and between columns $202_B$ and $202_C$ appear to be equal on FIG. 13, an uneven distribution of the columns on the mounting panel 170 is also contemplated.

The three connector legs 198 of the left support member 156 are configured to engage a set of three apertures 200 of the corresponding mounting panels 170 disposed on a same horizontal axis (i.e., one corresponding aperture 200 of each column $202_A$, $202_B$, $202_C$). In particular, the connector legs 198 of the support member 156 may be inserted in the enlarged portions 210 of the apertures 200 and then slid into the reduced portions 230 of the corresponding apertures 200.

Figure 15:
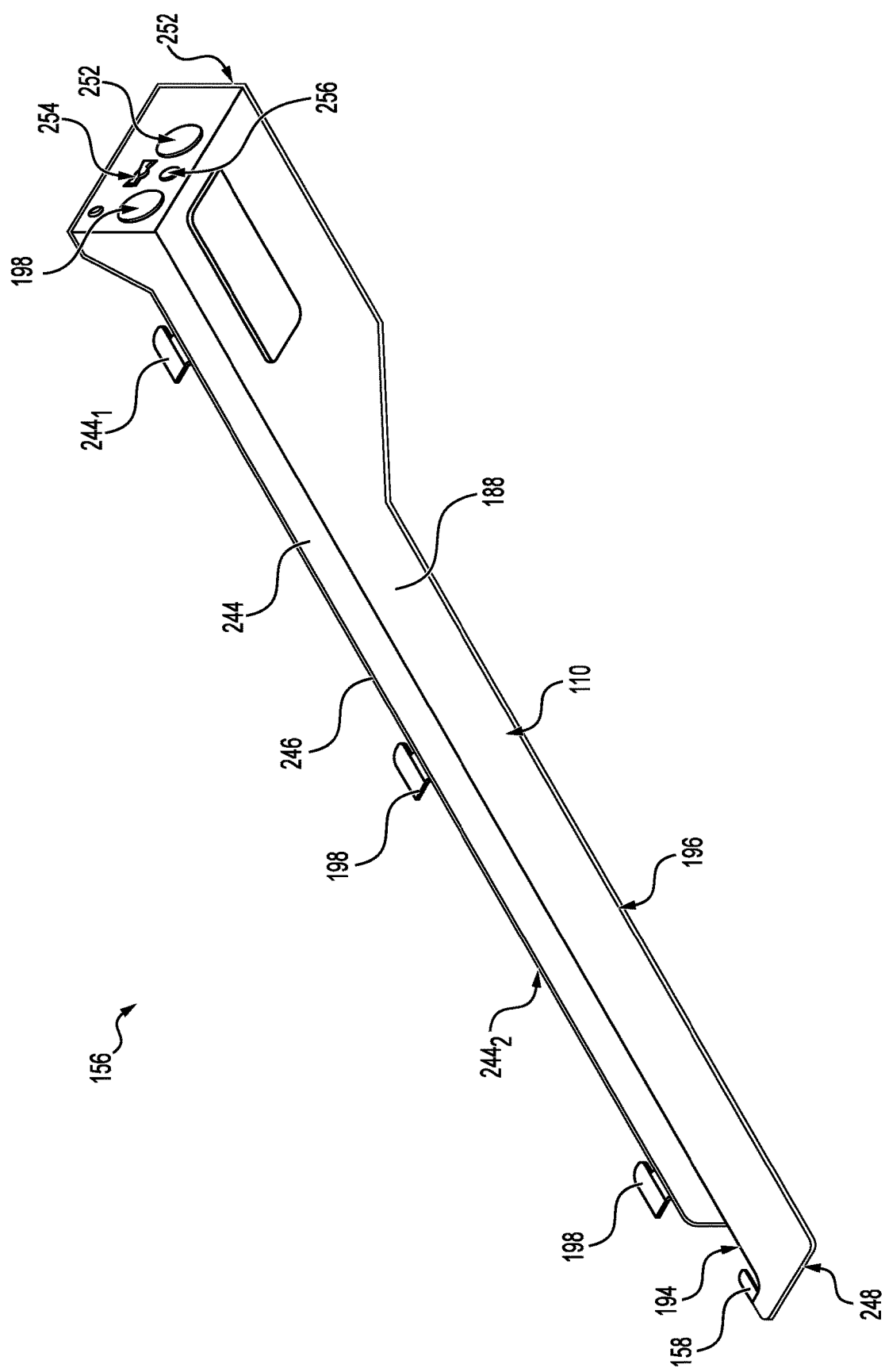
FIG. 15 is a perspective view, taken from a top, front, right side, of a left support member configured to be connected to the left mounting panel of FIG. 13 in accordance with an embodiment of the present technology.

Considering FIGS. 13 and 15, it is contemplated that the set of apertures 200 in a given rack stage 182 could be formed at somewhat different heights on the mounting panel, the vertically-extending portion 244 being formed to place the connector legs 198 of the support member 156 at corresponding vertical positions. For example, the apertures 200 of column $202_B$ could be placed slightly higher or lower than those of columns $202_A$ and $202_C$. As such, the apertures 200 of a given rack stage 182 are horizontally distributed without necessarily being exactly at a same height on the mounting panels 170.

It is also contemplated that the rack 152 may be constructed without the mounting panels 170, to thereby form an open rack. The open rack may therefore have a skeletal structure (not shown) including a plurality of hooks or fasteners (not shown) adapted for attachment of the support members 156 and 176.

Figure 16:
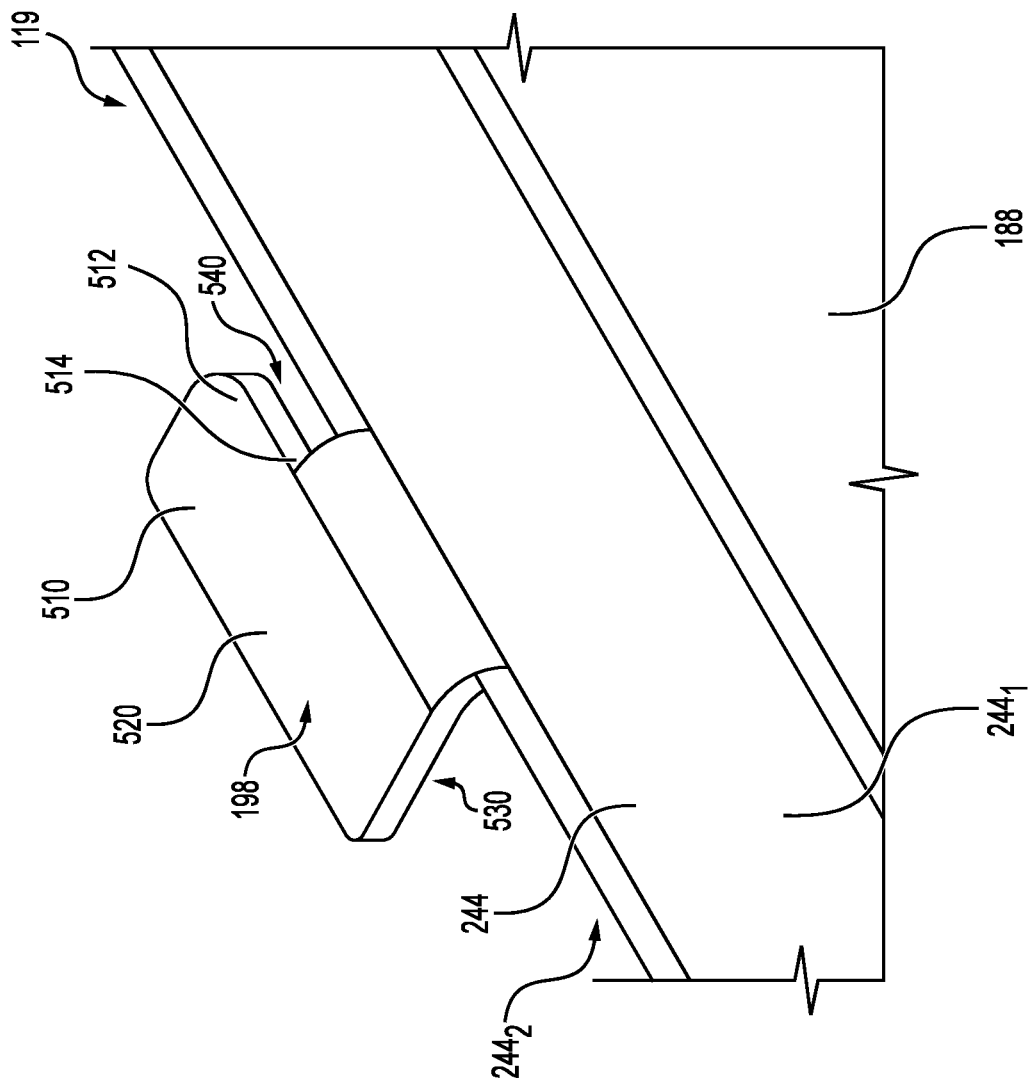
FIG. 16 is a perspective view of a connector leg of the left support member of FIG. 15 in accordance with an embodiment of the present technology.

A connector leg 198 according to a non-limiting embodiment of the present technology will now be described with reference to FIG. 16. In this particular embodiment, all of the connector legs 198 are identical and therefore it is to be understood that the same description applies to all of the connector legs 198 of the left and right support members 156, 176. The connector leg 198 described in FIG. 16 belongs to the left support member 156. Connector legs 198 of the right support member 176 are a mirror image of the connector legs 198 of the left support member 156 of FIG. 16. Therefore, only one the connector legs 198 of the left support member 156 will be described in detail herein. It is to be understood that the same description applies to the connector legs 198 of the right support member 176.

In this embodiment, the connector leg 198 has a hook portion 510 extending rearwardly to allow the connector leg 198 to be hooked onto a corresponding one of the apertures 200 as will be described below. The hook portion 510 is spaced from the external side surface $244_2$ such that an interlocking gap 540 is defined between the external side surface $244_2$ and the hook portion 510. In particular, the interlocking gap 540 is defined by the external side surface $244_2$ and by edges 512, 514 of the connector leg 198, the edges 512, 514 extending at a right angle to one another. The edge 512 is laterally spaced by the interlocking gap 540 from the external side surface $244_2$ and extends substantially parallel thereto.

In order to engage the connector legs 198 with the corresponding apertures 200 of the left mounting panel 170, in this embodiment, the connector legs 198 are inserted into the corresponding apertures 200 and slid along the apertures 200 in the depth direction of the rack 152 to hook the left support member 156 onto the left mounting panel 170. More specifically, for the left support member 156 for instance, each connector leg 198 is inserted in the enlarged portion 210 of the corresponding aperture 200 until the external side surface $244_2$ abuts an inner lateral surface of the mounting panel 170. The larger dimensions of the enlarged portion 210 of the apertures 200 facilitate insertion of the connector legs 198 into the apertures 200. The left support member 156 is then slid rearwardly such that each connector leg 198 slides into the reduced portion 230 of the corresponding aperture 200 until the edge 514 abuts the rear end 232 of the aperture 200. The tapering lower and upper ends 224, 226 (FIG. 14) defining the transition portion 220 of the aperture 200 help guide the connector legs 198 into the reduced portions 230.

When sliding the connector legs 198 along the apertures 200, the left support member 156 slides along the inner lateral surface of the mounting panel 170, and the inner edge 512 of each connector leg 198 slides along an outer lateral surface of the mounting panel 170 (laterally opposed to the inner lateral surface thereof). Part of the mounting panel 170 is thus disposed in the interlocking gap 540 defined by the left support member 156. Once each connector leg 198 is positioned in the reduced portion 230 of the corresponding aperture 200, the lower end 234 and the upper end 236 of the reduced portion 230 come in contact with upper and lower surfaces 520, 530 of the connector leg 198 respectively, in addition to the contact between the edge 514 of the connector leg 198 and the rear end 232 of the aperture 200. Therefore, the connector legs 198 can no longer be moved rearwardly, vertically or laterally.

Figure 19:
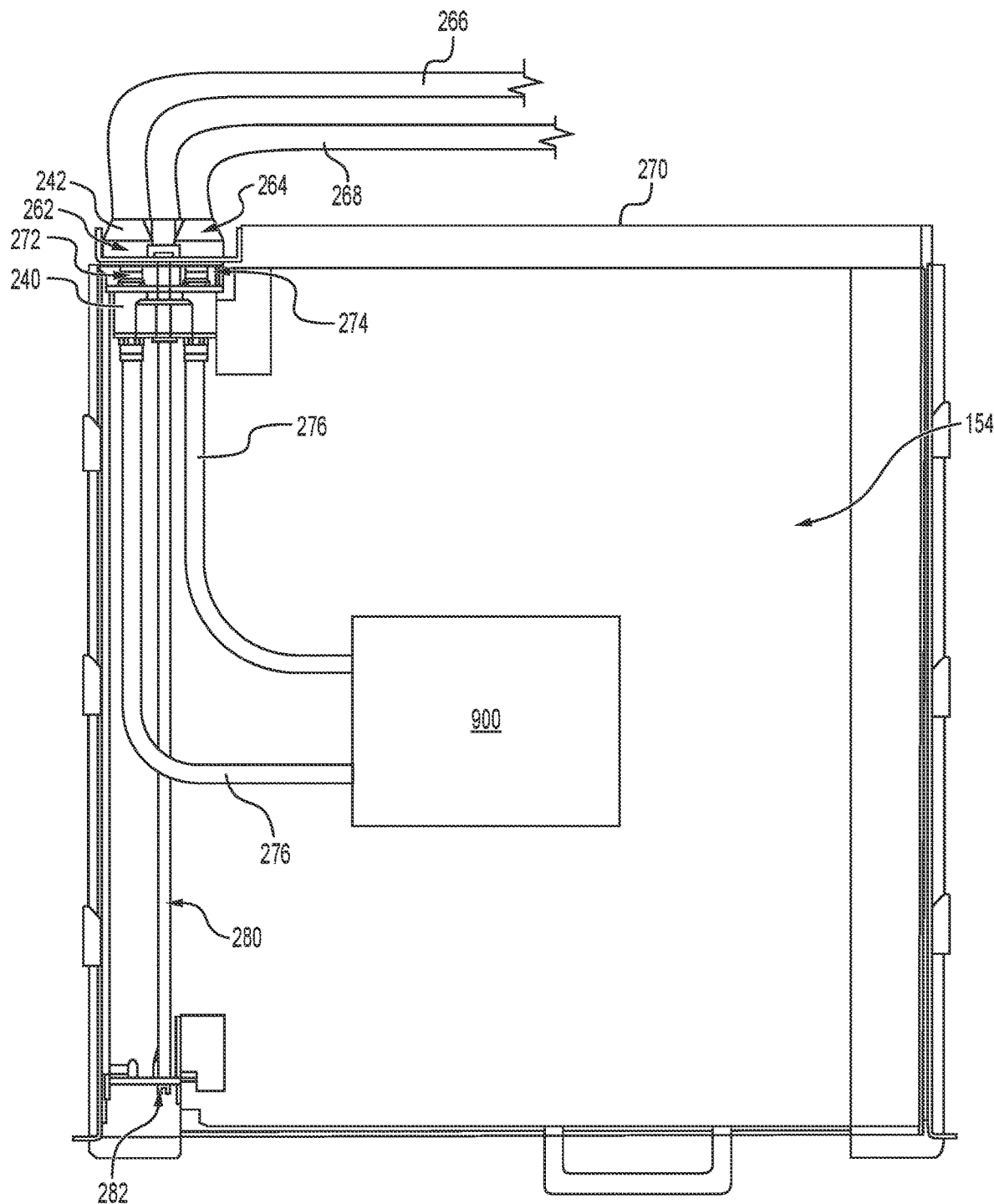
FIG. 19 is a top plan view of a component insertable in the rack of FIG. 11, the component comprising a fluidic connection for cooling purposes in accordance with an embodiment of the present technology.

Returning to the description of FIG. 15, in this embodiment, the left support member 156 also comprises a plate 248 for supporting a liquid connector 242 (FIG. 19). The plate 248 extends at an angle from a direction of insertion of the support member 156 in the rack 152. In the embodiment as shown, the plate 248 extends at a right angle from the horizontally-extending portion 188 and perpendicularly to the vertically-extending portion 244, such that it will be referred to as "upright plate" 248 below. As illustrated, the left support member 156 has a shape reminiscent of the shape of a corner brace. Configurations in which the upright plate 248 would be extending at different angles with respect to the horizontally-extending portion 188 and/or the vertically-extending portion 244 are also contemplated.

Two openings 250, 252 are defined in the upright plate 248 to host corresponding connectors of the liquid connector 242 as will be described in greater details herein further below. The upright plate 248 also defines a slot 254 proximal to the openings 250, 252. As will be described below, the slot 254 located on a given left support member 156 forms an attachment point for the liquid adaptor 242 located on a component 154 that is on the same rack stage 182 of the rack 152. As illustrated, a center of the opening 250, a center of the opening 252 and a center of the slot 254 on the same rack stage 182 generally form a triangle. The slot 254 may alternatively be positioned between the openings 250, 252.

The upright plate 248 also defines fastener openings 256 through which fasteners (e.g., bolts) may be inserted to connect the liquid connector 242 to the left support member 156.

In this embodiment, the left support member 156 further comprises a tab 258 on its front end 190. The tab 258 may be folded after mounting of the left support member 156 on the mounting panel 170 such that the tab 258 locks a position of the left support member 156 on the rack 152. As shown in FIG. 15, in its unfolded position, the tab 258 extends along the horizontally-extending portion 188. As best shown in FIG. 17, upon being inserted in a corresponding opening 205 of the left mounting panel 170, the tab 258 may be folded upwardly or downwardly (the tab 258 is folded downwardly in the illustrative embodiment of FIG. 17) to lock a position of the left support member 156 on the rack 152.

More specifically, the tab 258 is inserted in the opening 205 in its unfolded position. For example, the tab 258 or a portion thereof may be inserted on a side thereof in the opening 205 upon insertion of the connector legs 198 in the enlarged portions 210 of the apertures 200. As another example, the tab 258 may be inserted in the portion of the opening 205 extending through the front end 211 of the mounting panel 170 upon sliding of the connector legs 198 along the apertures 200 in the depth direction of the rack 152.

In this embodiment, the tab 258 is further folded such that, in its folded position, the tab 258 abuts a rear surface 260 of the vertically-extending front portion 221 of the left mounting panel 170. Therefore, the left support member 156 can no longer be moved frontwardly with respect to the rack 152.

The right support member 176 will now be described with reference to FIG. 18. In this embodiment, the right support member 176 is mounted on a right mounting panel 170 of the rack 152.

Similarly to the left support member 156, the right support member 176 has a horizontally-extending portion 188', or "plate" extending from a front end 190' to a rear end 252' between left and right lateral ends 194', 196'. As can be seen, the right support member 176 extends in the depth direction of the rack 152 such that, in use, the front end 190' is located proximate the front end 211 of a corresponding right mounting panel 170 while the rear end 252' is located proximate the rear end 220' of the right mounting panel 170. The right support member 176 also has a vertically-extending portion 244' extending from the left lateral end 194' of the horizontally-extending portion 188' at a right angle and defining an internal side surface $244_1'$ and an external side surface $244_2'$. In this embodiment, the right support member 176 has three connector legs 198' extending from the vertically-extending portion 244'. As described for the connector legs 198 of the left support member 156, each of the connector legs 198' of the right support member 176 is configured to engage with a respective aperture 200 of the corresponding right mounting panel 170 to connect the right support member 176 to the rack 152. In this embodiment, the connector legs 198' extend laterally from a top end 246' of the vertically-extending portion 244' and at a right angle from the vertically-extending portion 244'.

In this embodiment, the right support member 176 further comprises a tab 258' on its front end 190'. Similarly to the tab 258 of the left support member 156, the tab 258' may be folded such that, upon disposal of the right support member 176 on the right mounting panel 170, the tab 258' locks a position of the right support member 176. The right support member 176 can thus no longer be moved frontwardly with respect to the rack 152 when the tab 258' is folded against the rack 152.

In use, the electronic equipment of a given component 154 is disposed on the horizontally extending portions 188 of the corresponding left and right support members 156, 176. Optionally, in alternative embodiments, the left and right support members 156, 176 may be formed as single integral component, notably as a same metal sheet that is bent into shape to have its left and right lateral sides identical to the left and right support members 156, 176 described above.

Figure 18:
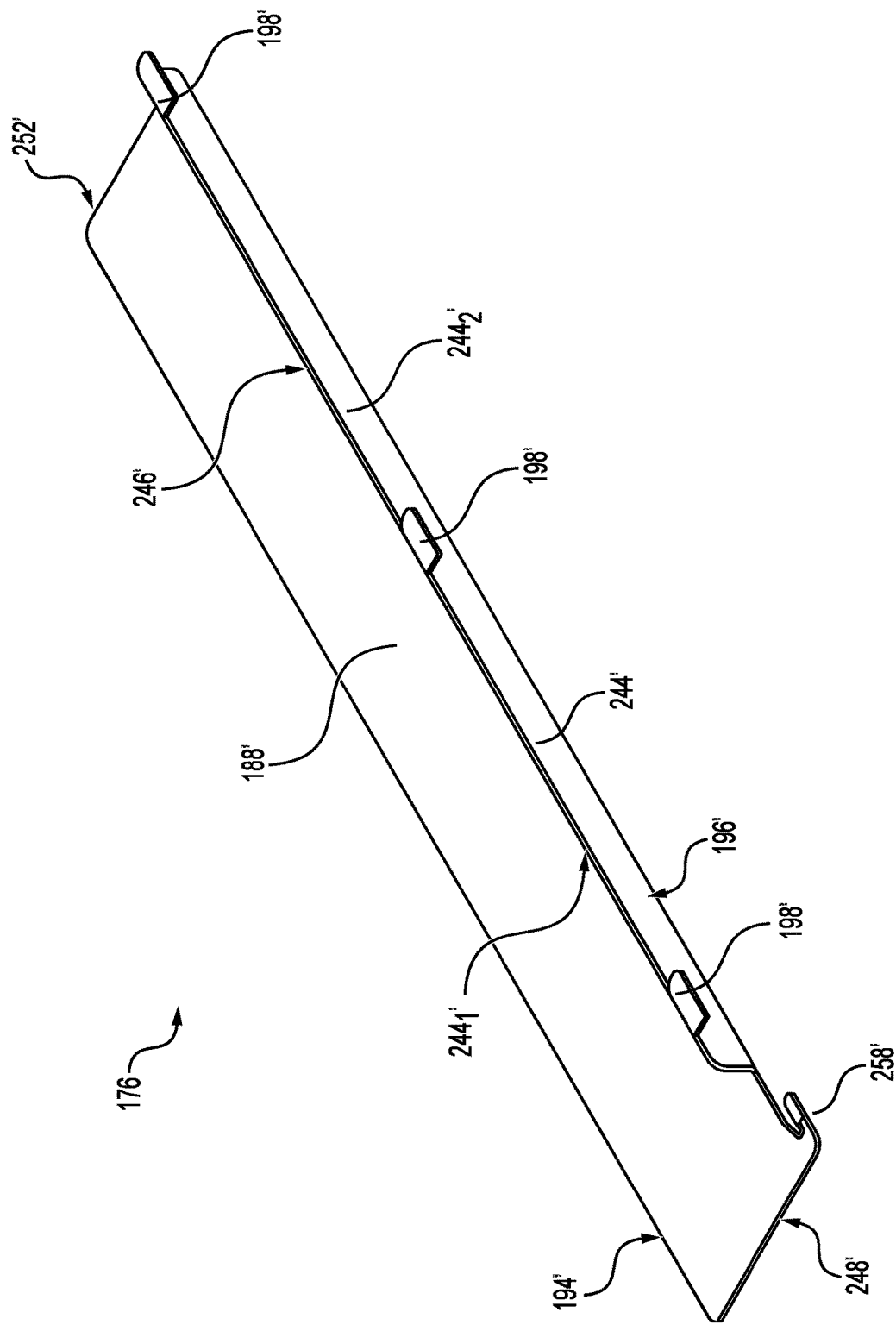
FIG. 18 is a perspective view, taken from a top, front, right side, of a right support member configured to be connected to a right mounting panel of the rack of FIG. 11 in accordance with an embodiment of the present technology.

Configurations in which the left and right support members 156, 176 would be respectively mirror images of the right and left support members 176, 156 as depicted in FIGS. 15 and 18 are also contemplated. Configurations in which the support member holding the liquid connector 242 would be the right support member are also contemplated.

FIG. 19 is a top plan view of a variant of a component 154 inserted in the rack 152 of FIG. 11, the component 154 providing a fluidic connection for cooling purposes via the liquid connector 240. FIG. 19 illustrates a non-limiting embodiment in which the liquid connector 240 is connected to the liquid adaptor 242 mounted on the left support member 156 for providing liquid cooling to the heat-generating units 900 (only one of which is depicted in FIG. 19). The liquid connector 242 comprises a feed port 262 and a return port 264. The feed port 262 is connected to a "cold" feed tube 266 mounted behind the upright plate 248 for distributing liquid, for example water, for cooling of the heat-generating units 900. The liquid returns to the return port 264 via a "hot" return tube 268.

The liquid connector 240 is mounted on the component 154, proximally to a rear edge 270 of the component 154. The liquid connector 240 comprises an inlet port 272 and an outlet port 274. The inlet port 272 and the outlet port 274 are respectively adapted for mating with the feed port 262 and with the return port 264 when the support member 156 and the component 154 are both fully inserted in the rack 152. A "cold" inlet tube 276 is connected to the inlet port 272 and extends to a water cooling device thermally connected to the heat-generating units 900 for providing liquid cooling thereto. As an example, the heat-generating units 900 may be equipped with water blocks (not shown) for receiving the liquid such that the liquid may collect thermal energy generated by the heat-generating units 900. As such, the inlet tube 276 may be connected to an inlet of the water block. A "hot" outlet tube 278 is connected to the outlet port 74 for conducting the heated liquid from the water cooling device to the outlet port 74. When the component 154 is fully installed, cooling liquid may be injected via the feed tube 266 and reach the inlet tube 276, the liquid returning to the return tube 268 via the outlet tube 278.

It may be noted that the pair formed by the feed port 262 and the inlet port 272 is interchangeable with the pair formed by the return port 264 and the outlet port 274. In fact, the hot and cold tubes may be connected to any one of the ports as long as consistency is maintained between these connections and a cooling system (not shown) of the rack 152 for providing liquid cooling to the heat-generating units 900.

In the embodiment of FIG. 19, the liquid connector 240 also comprises a rod 280 that extends at one end between the inlet and outlet ports 272, 274 and at another end to a front of the component 154. Operation of the elongate rod 280 is described hereinbelow.

Figure 20:
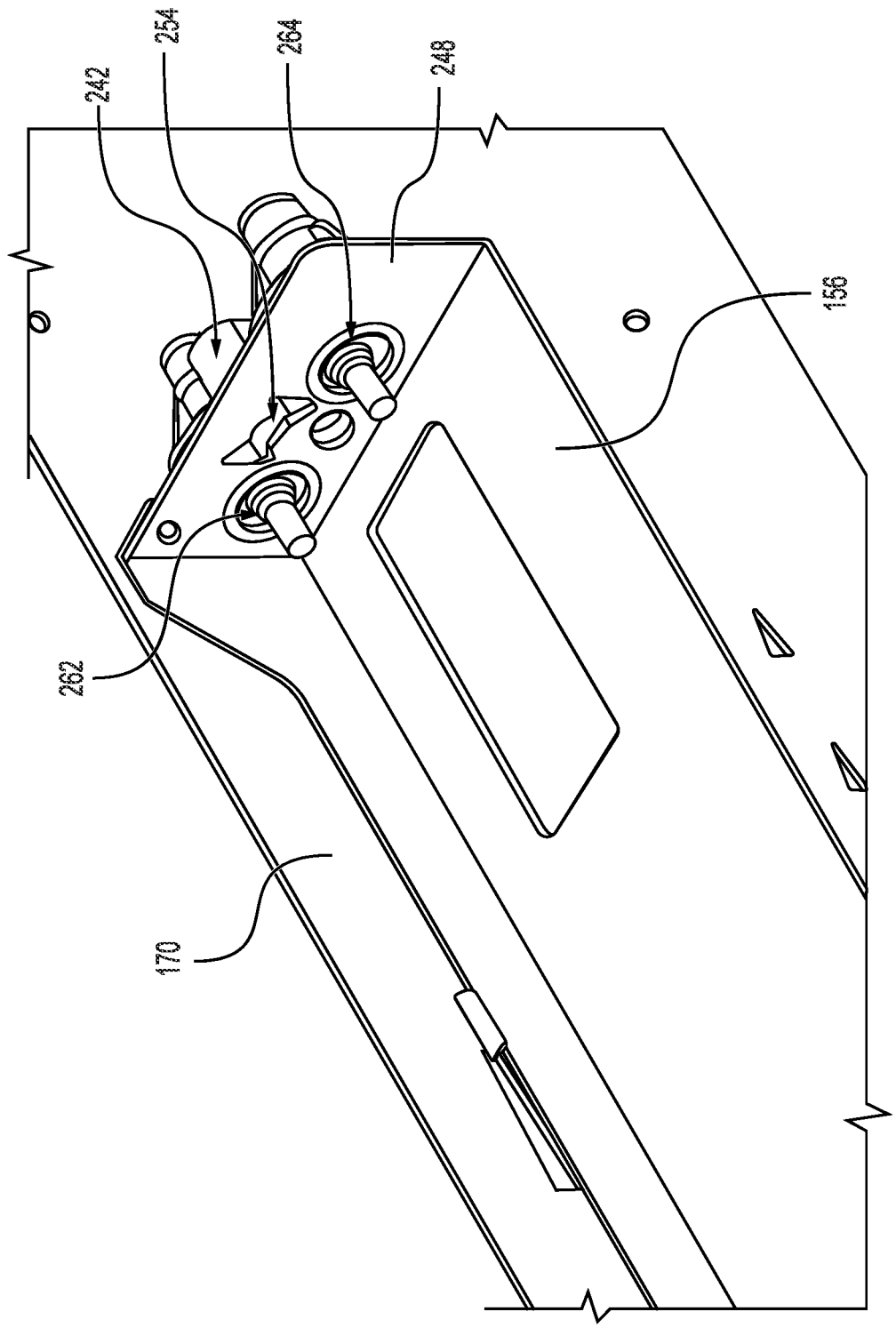
FIG. 20 is a perspective view, taken from a top, front, right side, of the left support member of FIG. 15 with a liquid connector mounted thereto, the left support member being connected to the left mounting panel of FIG. 13 in accordance with an embodiment of the present technology.

FIG. 20 illustrates the liquid connector 242 mounted on the left support member 156 according to a non-limiting embodiment of the present technology. In this particular and non-limiting embodiment, the feed and return ports 262, 264 are male connectors and the liquid connector 242 is mounted (e.g. bolted) on a rear side of the upright plate 248 such that portions of the feed and return ports 262, 264 extends frontwardly and through the corresponding openings 250, 252. The feed and return ports 262, 264 are defined in a plane parallel to the horizontally-extending portion 188 and perpendicular to the upright plate 248. Configurations in which the feed and return ports 262, 264 would be positioned vertically, one above the other, or defining an angle not parallel to a surface of the horizontally-extending portion 188, to mate with compatible ports of the liquid connector 240 are also contemplated.

Figure 21:
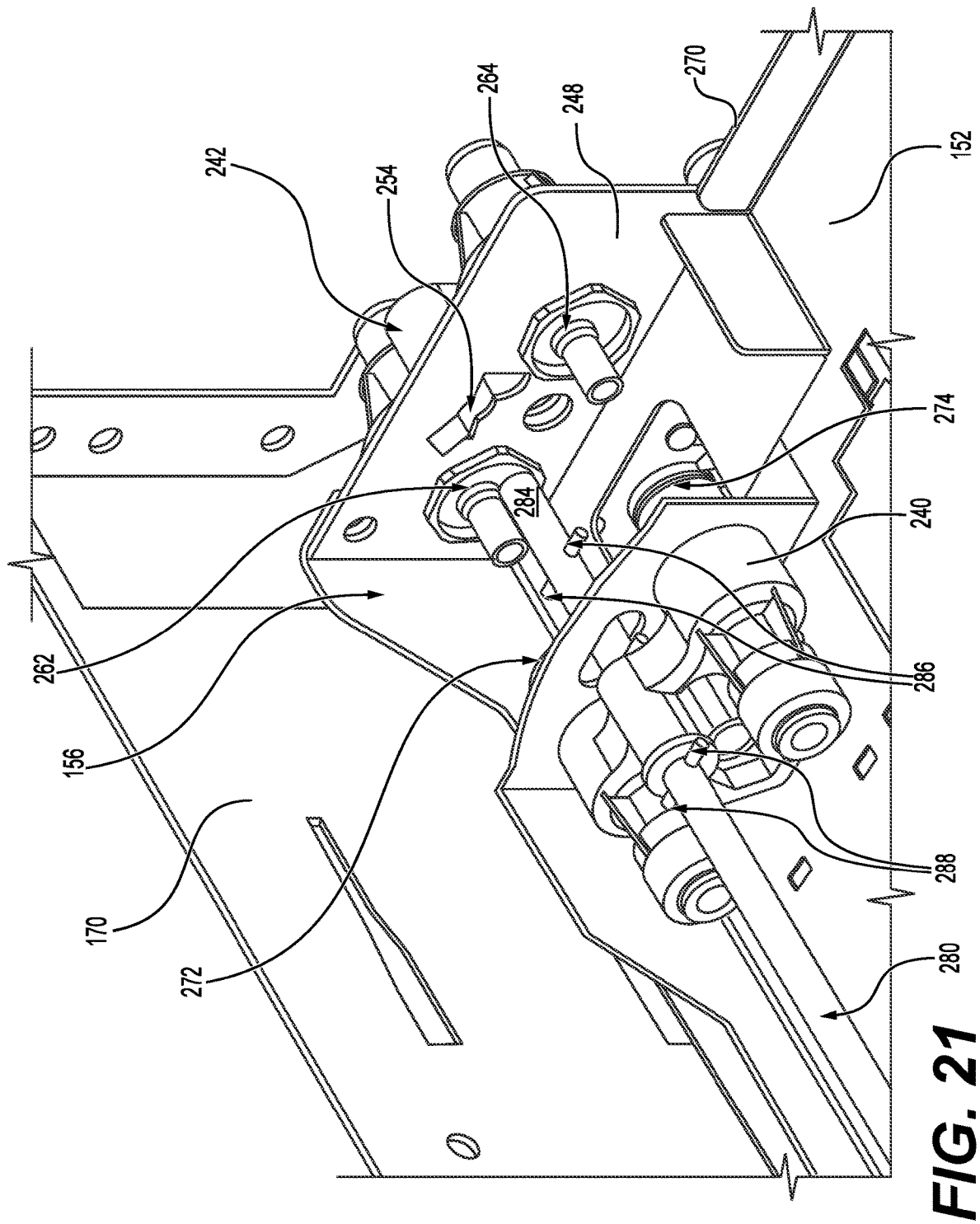
FIG. 21 is a perspective view, taken from a top, front, right side, of the component of FIG. 19 partially inserted in a rack in accordance with an embodiment of the present technology in accordance with an embodiment of the present technology.
Figure 22:
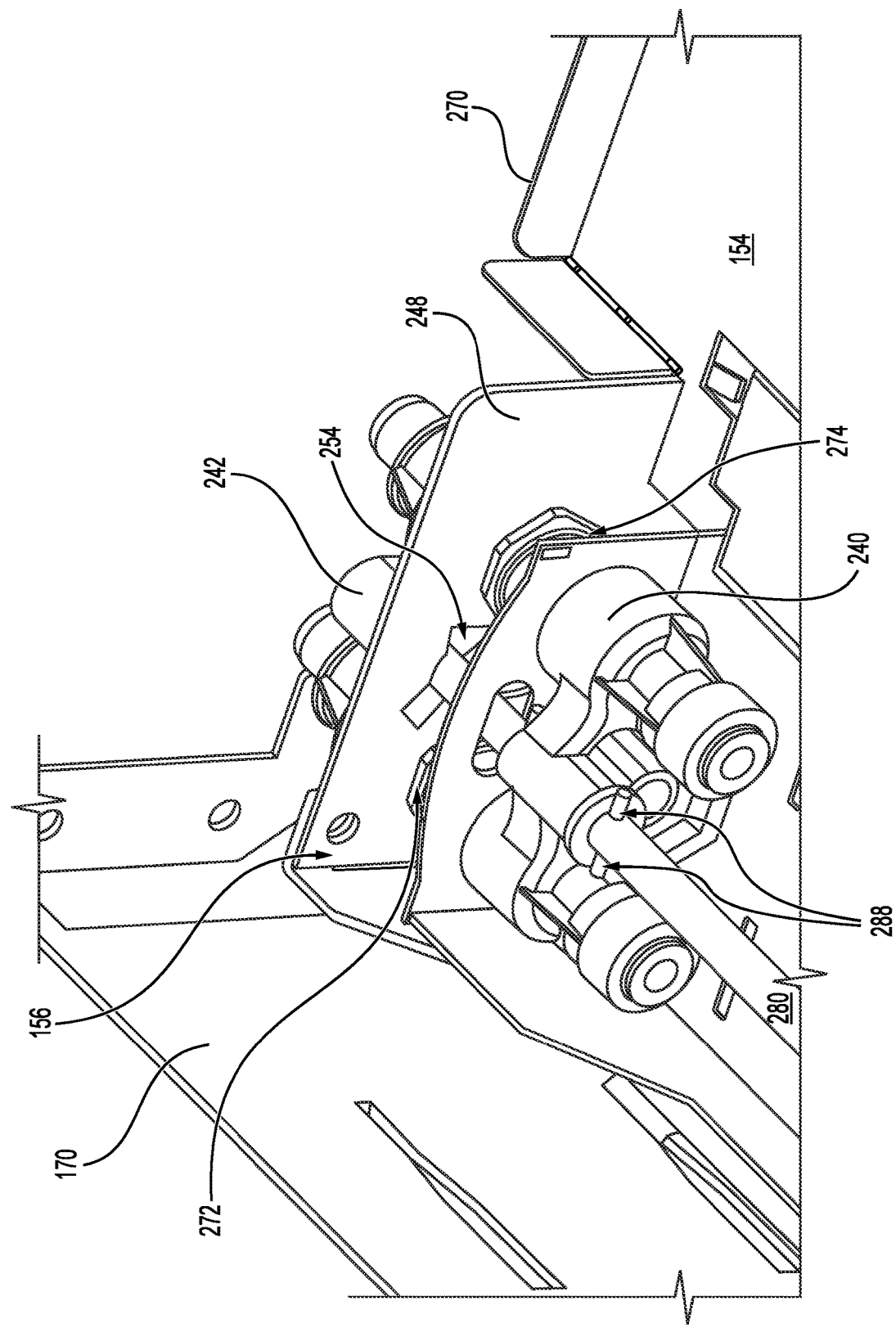
FIG. 22 is a perspective view, taken from a top, front, right side, of the component of FIG. 19 being substantially fully inserted in the rack in accordance with an embodiment of the present technology in accordance with an embodiment of the present technology.
Figure 23:
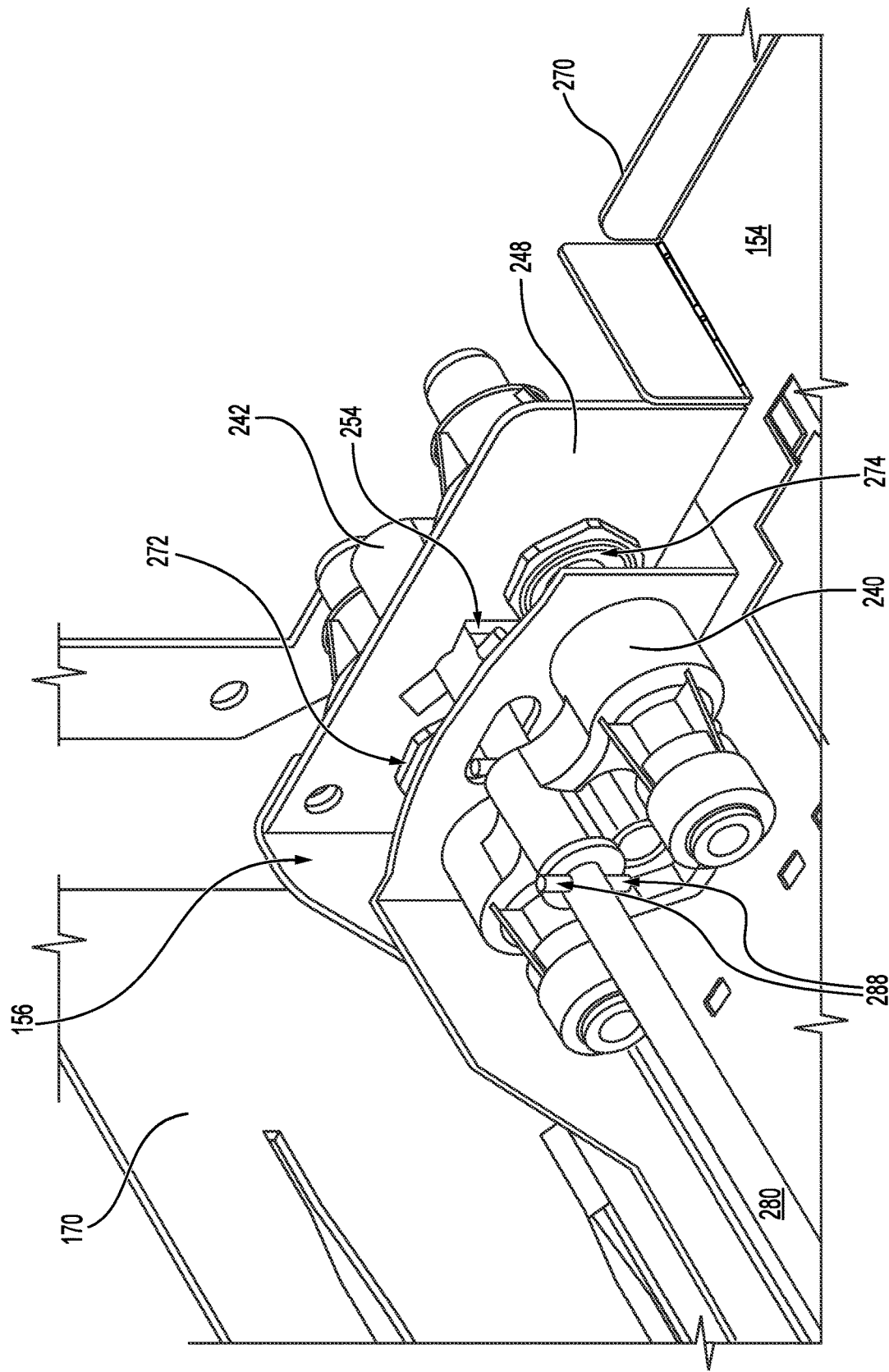
FIG. 23 is a perspective view, taken from a top, front, right side, of the component of FIG. 16 being fully inserted and locked in the rack in accordance with an embodiment of the present technology.
Figure 24:
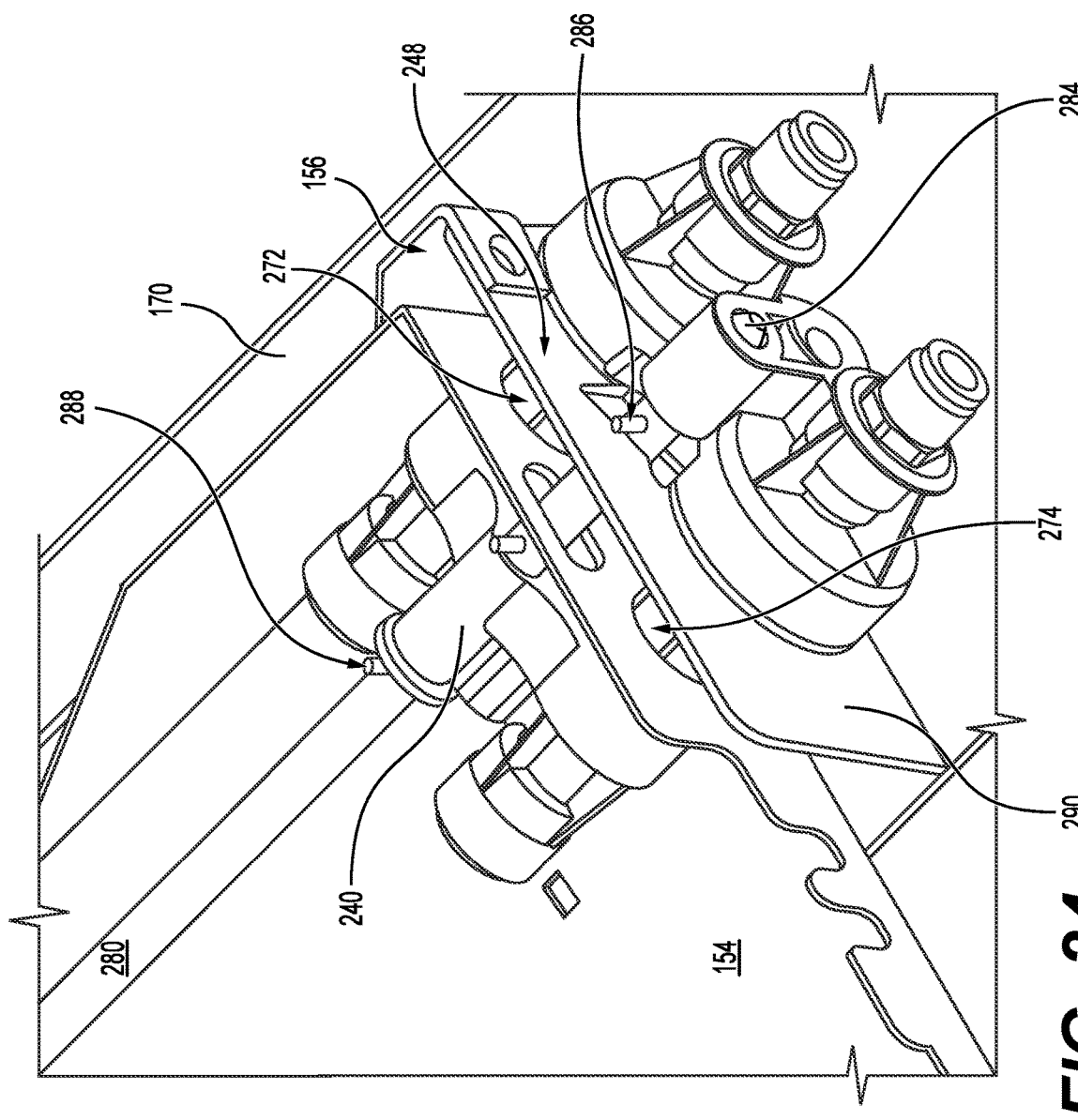
FIG. 24 is a perspective view, taken from a top, rear, right side, of the component of FIG. 16 being fully inserted and locked in the rack in accordance with an embodiment of the present technology.

FIG. 21 is a perspective, detailed view of the component 154 of FIG. 19 partially inserted in the rack 152. FIG. 22 is a perspective, detailed view of the component 154 of FIG. 19 being substantially fully inserted in the rack 152. FIG. 23 is a perspective, detailed view of the component 154 of FIG. 19 being fully inserted and locked in the rack 152. FIG. 24 is a perspective, detailed view, taken from the rear, of the component 154 of FIG. 19 being fully inserted and locked in the rack 152. The various tubes of FIG. 19 are omitted on FIGS. 21 to 24 in order to simplify the illustration. Referring at once to FIGS. 21 to 24, the feed port 262 and the return port 264 are mounted on the left support members 156 in each rack stage 182 of the rack 152.

In this particular and non-limiting embodiment, the inlet and outlet ports 272, 274 are female connectors for matching the male feed and return ports 262, 264. Configurations where the inlet and outlet ports 272, 274 are male connectors for matching female feed and return ports 262, 264 are also contemplated.

The liquid connector 240 is mounted (e.g. bolted) proximate the rear edge 270 of the component 154 such that a portion of the rod 280 extends rearwardly from the component 154. In this embodiment, the rod 280 is an elongate rod 280 extending from a front end 282 to a rear end section 284, the rod 280 being configured for receiving a rotation motion from a connectable handle, a screwdriver, or like tool (not shown). As best shown in FIG. 21, the elongate rod 280 has lateral extensions 286, such as pins, on the rear end section 284 of the elongate rod 280 that protrudes beyond the rear edge 270 of the component 154, the inlet port 272 and the outlet port 274.

The elongate rod 280 is rotated, for example manually, for aligning the lateral extensions 286 with the slot 254 formed in the upright plate 248 prior to full insertion of the component 154 in the rack 152, substantially as illustrated on FIG. 21. FIG. 22 shows that the rear end section 284 and the lateral extensions 286 have been inserted via the slot 254 within the upright plate 248. The rod 280 has not yet been rotated further from its position on FIG. 21, as evidenced by the orientation of pins 288 of the rod 280 that remains unchanged between FIGS. 21 and 22. FIGS. 23 and 24 show that the rod 280 is rotated about a quarter of a turn, as evidenced by the different orientation of the pins 288. The rotation of the rod 280 places the lateral extensions 286 out of alignment with the slot 254 after full insertion of the component 154 in the rack 152. This causes the lateral extensions 286 to abut on a rear face 290 of the upright plate 248 opposite from the component 154 to maintain the liquid connector 240 in place. There may be a slight movement of the component 154 in relation to the left support member 156 between FIGS. 22 and 23, the liquid connector 240 and the rear edge 270 of the component 154 being brought slightly closer to a rear-end of the rack 152 on FIGS. 22 and 23. This movement is caused by a pressure applied on the liquid connector 240 by the pins 288 when the lateral extensions 286 are slightly pulled inward of the upright plate 248 by the displacement of the rod 280 on the rear face 290 of the upright plate 248. This movement has at least a double effect, in which the component 154 is held firmly in place in the rack 152 while, in addition, watertight connections are established between the feed and inlet ports 262, 272 and between the return and outlet ports 264, 274. It may be noted that seals (not shown) such as for example Teflon™ or rubber rings may be provided to prevent leakage at the connections between the various ports.

In some applications, the connections of the inlet and outlet ports 272, 274 of the liquid connector 240 to the feed and return ports 262, 264 mounted on the upright plate 248 of the left support member 156 may suffice to provide proper alignment of the component 154 in the rack 152.

FIG. 25 is a sequence diagram of a method of mounting a component in the rack 152. On FIG. 25, a sequence 1500 comprises a plurality of operations that may be executed in variable order, some of the operations possibly being executed concurrently, some of the operations being optional. In the sequence 1500, operation 1510 comprises mounting the liquid connector 240 on a rear end of the component 154. In this embodiment, the two inlet and outlet ports 272, 274 of the liquid connector 240 may be mounted directly on the component 154. At operation 1520, the liquid connector 242 are mounted on the left support member 156 of the rack 152. More specifically, in this embodiment, the liquid connector 242 comprises the feed and return ports 262, 264 mounted on the plate 248 of the left support member 156.

At operation 1530, the left support member 156 is mounted in the rack 152, being connected to the left mounting panel 170. More specifically, in this embodiment, the connectors legs 198 of the left support member 156 are inserted in the apertures 200 and the tab 258 may be inserted in the opening 205 of the mounting panel 170. The tab 258 may be folded to abut the rear surface 260 of the vertically-extending front portion 221 of the mounting panel 170 such that, in use, the tab 258 and the connector legs 198 lock a position of the left support member 156. In an embodiment, at this step 1530, the right support member 176 may similarly be connected to the right mounting panel 170. In this embodiment, the connectors legs 198' of the right support member 176 are inserted in the apertures 200 of the right mounting panel 170 and the tab 258' may be inserted and further folded in the opening 205 of the right mounting panel 170 such that, in use, the tab 258 and the connector legs 198 lock a position of the left support member 156. In this embodiment, the left and right support members 156, 176 are thus disposed on a same horizontal axis so as to support the component 154 upon insertion thereof in the rack 152. It is contemplated that the right support member 176 may be mounted on the right mounting panel 170 using different techniques, for example being permanently connected thereto.

At operation 1540, the component 154 is inserted in the rack 152 until the inlet and outlet ports 272, 274 are connected to the feed and return ports 262, 264 respectively. In this embodiment, the feed and return ports 262, 264 are male ports and the inlet and outlet ports 272, 274 are female ports. Therefore, in this embodiment, the feed and return ports 262, 264 are received in the inlet and outlet ports 272, 274 at operation 1540. Operation 1540 may comprise one or more of sub-operations 1542, 1544 and 1546, these sub-operations being executed when the liquid connectors 240 and 242 are used. At sub-operation 1542, the lateral extensions 286 of the rod 280 are substantially aligned with the slot 254 formed on the plate 248. At sub-operation 1544, the component 154 is inserted in the rack 152 until the rear end section 284 of the rod 280 is inserted in the slot 254. At sub-operation 1546, after full insertion of the component 154 in the rack 152, the rod 280 is rotated for placing the lateral extensions 286 out of alignment with the slot 254 to cause the lateral extensions to abut on the rear face 290 of the plate 248 opposite from the component 154 to maintain the component 154 inserted in the rack 152. If conventional quick-connect adaptors are used in place of the liquid connectors 240 and 242, sub-operations 1542, 1544 and 1546 are not executed. Visual and/or manual inspection may help in ensuring that the liquid connectors mounted on the component 154 and on the support member 156 are properly connected.

While the above-described implementations have been described and shown with reference to particular steps performed in a particular order, it will be understood that these steps may be combined, sub-divided, or re-ordered without departing from the teachings of the present technology. At least some of the steps may be executed in parallel or in series. Accordingly, the order and grouping of the steps is not a limitation of the present technology.

It should be expressly understood that not all technical effects mentioned herein need to be enjoyed in each embodiment of the present technology.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A system, comprising:
  a rack;
  a support member configured to be selectively inserted in the rack, the support member comprising a plate at its rear end, the plate extending at an angle from a direction of insertion of the support member in the rack, the support member further comprising a first liquid connector that is mounted to the plate prior to the support member being inserted in the rack; and
  a component configured for being supported in the rack by the support member, the component comprising a second liquid connector mounted on a rear edge of the component prior to the component being inserted in the support member, the second liquid connector being configured for connecting to the first liquid connector when the support member and the component are inserted in the rack.

2. The system of claim 1, wherein:
  the first liquid connector comprises a feed port and a return port mounted on the plate;
  the second liquid connector comprises an inlet port and an outlet port;
  the inlet port is adapted for mating with the feed port when the first and second liquid connectors are connected; and
  the outlet port is adapted for mating with the return port when the first and second liquid connectors are connected.

3. The system of claim 2, further comprising:
  a feed tube connected to the feed port; and
  a return tube connected to the return port;
  wherein the feed tube and the return tube extend behind the plate of the support member for providing liquid cooling to the component.

4. The system of claim 3, further comprising:
  an inlet tube mounted to the inlet port; and
  an outlet tube mounted to the outlet port;
  wherein the inlet tube and the outlet tube are mounted on the component for distributing liquid cooling to a heat-generating unit of the component.

5. The system of claim 2, wherein:
  a slot is formed on the plate; and
  the component comprises a rod having lateral extensions on an end section protruding beyond the rear edge of the component, the rod being rotatable for aligning the lateral extensions with the slot upon mounting the component in the rack, for allowing insertion of the end section in the slot and for subsequently placing the lateral extensions out of alignment with the slot to cause the lateral extensions to abut on a face of the plate opposite from the component for maintaining a connection of the first and second liquid connectors.

6. The system of claim 5, wherein the slot is formed between the feed port and the return port.

7. The system of claim 5, wherein a center of the feed port, a center of the return port and a center of the slot form a triangle.

8. The system of claim 5, wherein the rod extends to a front edge of the component.

9. The system of claim 1, wherein the first liquid connector is a male liquid connector and the second liquid connector is a female liquid connector.

10. The system of claim 1, wherein the first liquid connector is a female liquid connector and the second liquid connector is a male liquid connector.

11. The system of claim 1, wherein:
the rack comprises two opposite mounting panels;
the support member is a first support member configured for mounting on one of the mounting panels;
the system further comprises a second support member configured for mounting on another one of the mounting panels; and
the component is configured for being supported in the rack by the two mounting panels.

12. The system of claim 11, wherein:
each mounting panel comprises a plurality of rack mounting features distributed along a same horizontal axis, corresponding rack mounting features being disposed at corresponding heights on the two mounting panels; and
the first and second support members each comprise a plurality of connector legs configured for connecting to corresponding ones of the rack mounting features when the first and second support members are inserted in the rack.

13. The system of claim 1, wherein:
the support member further comprises an elongate plate extending from a front end to the rear end of the support member;
the plate extends perpendicularly from the elongate plate; and
the support member further comprises a tab positioned on its front end, the tab being adapted for being folded against the rack for locking a position of the support member when mounted in the rack.

14. The system of claim 1, wherein the rack defines a plurality of parallel stages, each respective stage being adapted for receiving a respective support member and a respective component.

15. The system of claim 14, wherein a spacing between each of the plurality of parallel stages corresponds to a standard-size rack unit.

16. The system of claim 1, wherein the component is a server.

17. A system, comprising:
a rack with a plurality of parallel stages, each respective stage being adapted for receiving a support member and a component;
a plurality of support members, each support member configured to be selectively inserted in a stage of the rack, each support member comprising a plate at its rear end, the plate extending at an angle from a direction of insertion of the support member in the rack, each support member further comprising a first liquid connector that is mounted to the plate prior to the support member being inserted in the rack; and
a plurality of components, each component configured for being supported in the rack by a support member of the plurality of support members, the component comprising a second liquid connector mounted on a rear edge of the component prior to the component being inserted in its respective support member, the second liquid connector being configured for connecting to the first liquid connector when the support member and the component are inserted in the rack.

18. The system of claim 17, wherein a spacing between each of the plurality of parallel stages corresponds to a standard-size rack unit.

19. A method for mounting a component in a rack, the method comprising:
mounting a first liquid connector to a plate of a support member prior to the support member being inserted in the rack, wherein the plate is at a rear end of the support member, and wherein the plate extends at an angle from a direction of insertion of the support member in the rack;
mounting a second liquid connector to a component prior to the component being inserted in the support member, wherein the second liquid connector is configured for connecting to the first liquid connector when the support member and the component are inserted in the rack;
inserting the support member in the rack; and
inserting the component in the support member until the first and second liquid connectors are connected.

* * * * *